US009081142B2

(12) United States Patent
Hsu et al.

(10) Patent No.: US 9,081,142 B2
(45) Date of Patent: *Jul. 14, 2015

(54) PHOTOSENSITIVE RESIN COMPOSITION FOR A COLOR FILTER AND USES THEREOF

(71) Applicant: CHI MEI CORPORATION, Tainan (TW)

(72) Inventors: Jung-Pin Hsu, Tainan (TW); Duan-Chih Wang, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/281,505

(22) Filed: May 19, 2014

(65) Prior Publication Data

US 2014/0346416 A1   Nov. 27, 2014

(30) Foreign Application Priority Data

May 24, 2013  (TW) .............................. 102118330 A

(51) Int. Cl.
| | | |
|---|---|---|
| *G02B 5/20* | (2006.01) | |
| *G03F 7/004* | (2006.01) | |
| *G02B 5/23* | (2006.01) | |
| *G03F 7/00* | (2006.01) | |
| *G02B 5/22* | (2006.01) | |

(52) U.S. Cl.
CPC ............ *G02B 5/23* (2013.01); *G02B 5/223* (2013.01); *G03F 7/0007* (2013.01)

(58) Field of Classification Search
CPC .. G03F 7/0007; G02B 5/223; G02F 1/133516

USPC ........................................ 430/7, 270.1, 287.1
See application file for complete search history.

(56) References Cited

U.S. PATENT DOCUMENTS

| | | | |
|---|---|---|---|
| 2004/0241578 A1 | 12/2004 | Hirai | |
| 2007/0160776 A1 | 7/2007 | Kwon et al. | |

FOREIGN PATENT DOCUMENTS

| | | | |
|---|---|---|---|
| JP | H09-095638 | | 4/1997 |
| JP | H09-197663 | | 7/1997 |
| JP | 2006-079012 | | 3/2006 |
| JP | 2012-212005 A | * | 11/2012 |
| TW | 201040151 A | | 11/2010 |
| TW | 201308010 A | | 2/2013 |

OTHER PUBLICATIONS

Computer-generated translation of JP 2012-212005 (Nov. 2012).*
Office action issued on Apr. 16, 2015 for the corresponding Taiwan Patent Application No. 102118330.
English abstract translation of Office action issued on Apr. 16, 2015 for the corresponding Taiwan Patent Application No. 102118330.
English abstract translation of TW 201308010 A ( Feb. 2013 ).
English abstract translation of TW 201040151 A ( Nov. 2010 ).

* cited by examiner

*Primary Examiner* — John A McPherson
(74) *Attorney, Agent, or Firm* — WPAT, P.C.; Anthony King

(57) ABSTRACT

The invention relates to a blue photosensitive resin composition, and it has the advantage of good developing-resistance, good ageing stability of sensitivity and good contrast. The invention also provides a method for producing a color filter, a color filter and a liquid crystal display device.

16 Claims, 1 Drawing Sheet

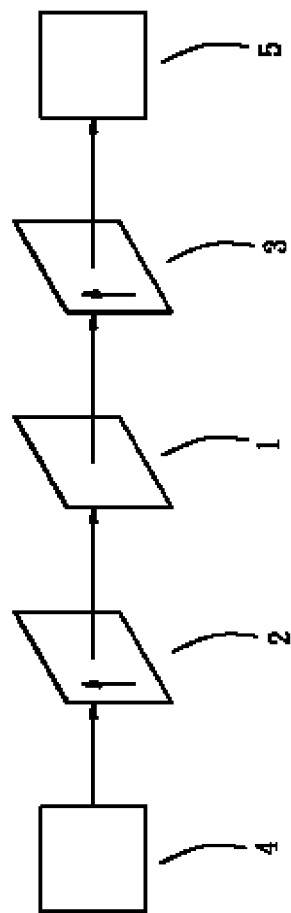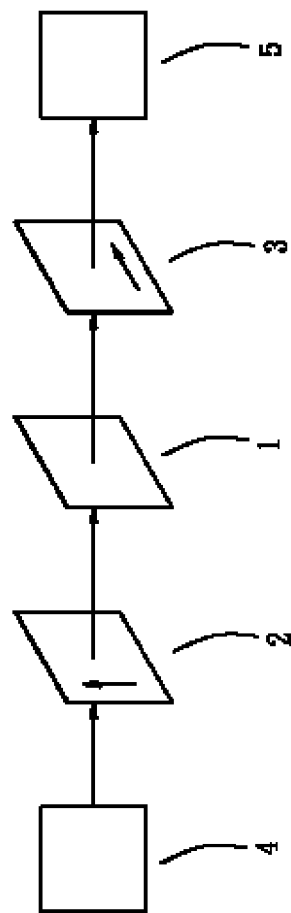

PHOTOSENSITIVE RESIN COMPOSITION FOR A COLOR FILTER AND USES THEREOF

BACKGROUND OF THE INVENTION

1. Field of the Invention

The invention relates to a blue photosensitive resin composition for a color filter and a liquid crystal display device formed therefrom; particularly, to a blue photosensitive resin composition for a color filter having good developing-resistance, good ageing stability of sensitivity and good contrast.

2. Description of the Related Art

Along with advancing technology and broadening applications, large-sized liquid crystal display devices with high color reproduction, such as liquid crystal display televisions, are being actively developed. Generally, NTSC color reproduction of desktop liquid crystal display devices ranges roughly from 50 percent to 60 percent while NTSC color reproduction of the liquid crystal television ranges roughly from 60 percent to 75 percent. Therefore, mere application of the components for the desktop liquid crystal display device, such as a liquid crystal display element and a backlight unit (for example, cold cathode fluorescent lamp (CCFL)), to the liquid crystal display television is not able to satisfy the color reproduction requirement for the liquid crystal display television.

When the backlight unit of the desktop liquid crystal display is used for the liquid crystal display television, a color filter must have a thicker blue filter segment or a denser blue pigment to satisfy the requirement of the color reproduction for the liquid crystal display television, which, however, may lead to drastic decrease in light permeability of the blue color filter segment.

JP-H09-095638 discloses a blue photosensitive resin composition for forming a color filter which is composed of an alpha-copper phthalocyanine blue pigment, an epsilon-copper phthalocyanine blue pigment, a photosensitive resin, a photoinitiator, and a solvent. Furthermore, JP-H09-197663 also discloses a blue photosensitive resin composition for forming a color filter which is composed of a copper phthalocyanine blue pigment, an indanthrone blue pigment, a photosensitive resin, a photoinitiator, and a solvent. These two blue photosensitive resin compositions can solve the above-mentioned light permeability issues.

The blue photosensitive resin compositions disclosed in the above-mentioned patents both use different blue pigments to improve the light permeability. However, the increase of the concentration of the pigments would lead to the decrease of the contrast of the color filter comprising the blue photosensitive resin compositions because light scattering occurring due to the particle diameter of the pigments. Therefore, Japanese Patent Publication No. 2006-079012 discloses a pyrazole squarylium dye that only absorbs light to present color and a blue pigment 15:6 to increase the contrast of the color filter. However, the ageing stability and developing-resistance are both not satisfactory.

Furthermore, in order to meet the modern requirement of color saturation, the concentration of the pigment must be raised and a high-dose photoinitiator must be incorporated. However, when mixing the high-concentration pigment and a common photoinitiator, the ageing stability is poor. In addition, using the high-concentration pigment, the ratio of the pigment of the photosensitive resin composition is also high and the used amounts of an alkali-soluble resin and photosensitive monomer decrease. Such phenomenon leads the decrease of the degree of cross-linking after exposure and poor develop-resistance.

Therefore, improving developing-resistance, ageing stability of sensitivity and contrast of the liquid crystal display device to meet the modern requirements is a target remained to be achieved in the technical field of the present invention.

SUMMARY OF THE INVENTION

In the present invention, the specific contents of a cationic polymeric compound and cationic photoinitiator are provided to obtain a blue photosensitive resin composition for a color filter having good developing-resistance, good ageing stability of sensitivity and good contrast.

Therefore, the invention relates to a blue photosensitive resin composition for a color filter comprising:
an organic pigment (A);
a dye (B);
an alkali-soluble resin (C);
a cationic polymeric compound (D);
a cationic photoinitiator (E); and
an organic solvent (F);
wherein the dye (B) comprises a red dye represented by Formula (I):

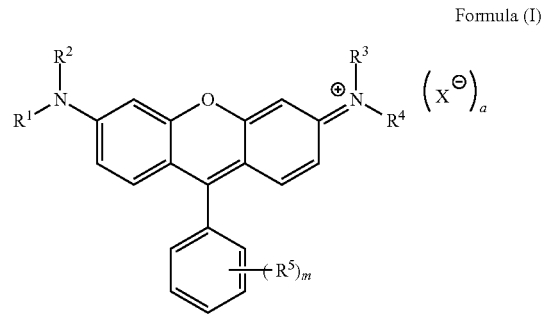

Formula (I)

wherein:
$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of halogen, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;
$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;
m is an integer ranging from 0 to 5, a plurality of $R^5$s being the same or different when m is from 2 to 5;
X represents halogen;
a is 0 or 1;
$R^6$ is a $C_1$-$C_{10}$ alkyl group unsubstituted or substituted with halogen; wherein —$CH_2$— contained in said $C_1$-$C_{10}$ alkyl group is un-replaced or replaced with —O—, carbonyl, or —$NR^7$—;
$R^7$ is a $C_1$-$C_{10}$ alkyl group unsubstituted or substituted with halogen;
$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein the hydrogen in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —OH, halogen, -Q, —CH=$CH_2$, and —CH=CH—$R^6$; and the —$CH_2$— in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —O—, carbonyl, and —$NR^7$—; or $R^8$ and $R^9$ join together to form a $C_1$-$C_{10}$ heterocyclic group; wherein the hydrogen in the $C_1$-$C_{10}$ heterocyclic group is unsubstituted or substituted with a substituent selected from the group consisting of $R^6$, —OH and -Q;

Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of halogen, —$R^6$, —OH, —$OR^6$, —$NO_2$, —CH=$CH_2$, and —CH=CH—$R^6$, and a $C_5$-$C_{10}$ heteroaryl group substituted with a substituent selected from the group consisting of halogen, —$R^6$, —OH, —$OR^6$, —$NO_2$, —CH=$CH_2$, and —CH=CH—$R^6$; and M is selected from the group consisting of potassium and sodium.

The present invention also provides a method for manufacturing a color filter comprising forming a pixel layer with the blue photosensitive resin composition for a color filter as mentioned above.

The present invention also provides a color filter manufactured by the method as mentioned above.

The present invention further provides a liquid crystal display device comprising the color filter as mentioned above.

BRIEF DESCRIPTION OF THE DRAWINGS

FIG. 1 is a schematic view depicting a contrast measurement state (1) of the photosensitive resin layer; and FIG. 2 is a schematic view depicting a contrast measurement state (2) of the photosensitive resin layer.

DETAILED DESCRIPTION OF THE INVENTION

The invention relates to blue photosensitive resin composition for a color filter comprising:
an organic pigment (A);
a dye (B);
an alkali-soluble resin (C);
a cationic polymeric compound (D);
a cationic photoinitiator (E); and
an organic solvent (F);
wherein the dye (B) comprises a red dye represented by Formula (I):

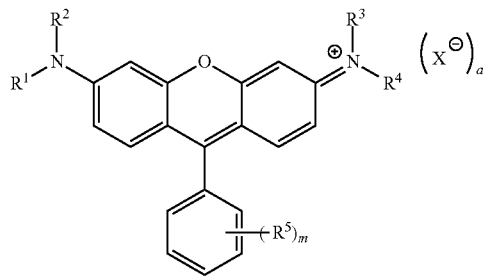

Formula (I)

wherein:
$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of halogen, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;

$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;

m is an integer ranging from 0 to 5, a plurality of $R^5$s being the same or different when m is from 2 to 5;

X represents halogen;

a is 0 or 1;

$R^6$ is a $C_1$-$C_{10}$ alkyl group unsubstituted or substituted with halogen; wherein —$CH_2$— contained in said $C_1$-$C_{10}$ alkyl group is un-replaced or replaced with —O—, carbonyl, or —$NR^7$—;

$R^7$ is a $C_1$-$C_{10}$ alkyl group unsubstituted or substituted with halogen;

$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein the hydrogen in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —OH, halogen, -Q, —CH=$CH_2$, and —CH=CH—$R^6$; and the —$CH_2$— in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —O—, carbonyl, and —$NR^7$—; or $R^8$ and $R^9$ join together to form a $C_1$-$C_{10}$ heterocyclic group; wherein the hydrogen in the $C_1$-$C_{10}$ heterocyclic group is unsubstituted or substituted with a substituent selected from the group consisting of $R^6$, —OH and -Q;

Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of halogen, —$R^6$, —OH, —$OR^6$, —$NO_2$, —CH=$CH_2$, and —CH=CH—$R^6$, and a $C_5$-$C_{10}$ heteroaryl group substituted with a substituent selected from the group consisting of halogen, —$R^6$, —OH, —$OR^6$, —$NO_2$, —CH=$CH_2$, and —CH=CH—$R^6$; and M is selected from the group consisting of potassium and sodium.

The organic pigment (A) provides a blue pigment.

In one embodiment of the invention, the used amount of the organic pigment (A) is from 30 to 300 parts by weight based on 100 parts by weight of the used amount of the alkali-soluble resin (C); preferably from 40 to 270 parts by weight; more preferably from 50 to 250 parts by weight.

Preferably, the organic pigment (A) includes a copper phthalocyanine-based blue pigment (A-1). Examples of the copper phthalocyanine-based blue pigment (A-1) can be used alone or in admixture of two or more thereof, and include, but are not limited to, C.I. Pigment Blue 15:1, C.I. Pigment Blue 15:2, C.I. Pigment Blue 15:3, C.I. Pigment Blue 15:4, C.I. Pigment Blue 15:5, and C.I. Pigment Blue 15:6.

In one embodiment of the invention, the used amount of the copper phthalocyanine-based blue pigment (A-1) is from 20 to 200 parts by weight based on 100 parts by weight of the used amount of the alkali-soluble resin (C); preferably from 30 to 180 parts by weight; more preferably from 40 to 160 parts by weight.

Preferably, the organic pigment (A) further includes a violet pigment (A-2). Examples of the violet pigment (A-2) can be used alone or in admixture of two or more thereof, and include, but are not limited to, C.I. Pigment Violet 14, C.I.

Pigment Violet 19, C.I. Pigment Violet 23, C.I. Pigment Violet 29, C.I. Pigment Violet 32, C.I. Pigment Violet 33, C.I. Pigment Violet 36, C.I. Pigment Violet 37, C.I. Pigment Violet 38, C.I. Pigment Violet 40, and C.I. Pigment Violet 50.

In one embodiment of the invention, the used amount of the violet organic pigment (A-2) is from 10 to 100 parts by weight based on 100 parts by weight of the used amount of the alkali-soluble resin (C); preferably from 10 to 90 parts by weight; more preferably from 10 to 60 parts by weight.

When the organic pigment (A) comprises the violet organic pigment (A-2), color reproduction of a color liquid crystal display device is improved.

The organic pigment (A) may further include a blue pigment (A-3) besides (A-1). Examples of the blue pigment (A-3) can be used alone or in admixture of two or more thereof, and include, but are not limited to, C.I. Pigment Blue 1, C.I. Pigment Blue 21, C.I. Pigment Blue 22, C.I. Pigment Blue 60, C.I. Pigment Blue 61, and C.I. Pigment Blue 64.

In another embodiment of the invention, the organic pigment (A) further comprises a halogenated-phthalocyanine-based green pigment so as to adjust chromaticity.

Preferably, examples of the halogenated-phthalocyanine-based green pigment can be used alone or in admixture of two or more thereof, and include, but are not limited to C.I. Pigment Green 07, C.I. Pigment Green 36, C.I. Pigment Green 37, C.I. Pigment Green 42, C.I. Pigment Green 58, and combinations thereof. More preferably, the halogenated-phthalocyanine-based green pigment is selected from C.I. Pigment Green 07, C.I. Pigment Green 36, C.I. Pigment Green 37, C.I. Pigment Green 42, and C.I. Pigment Green 58.

The dye (B) is beneficial for improving brightness and adjusting chromaticity of the blue photosensitive resin composition. The color liquid crystal display device made without using the dye component (B) has inferior color reproduction.

Preferably, the dye (B) the dye (B) comprises a red dye represented by Formula (I):

Formula (I)

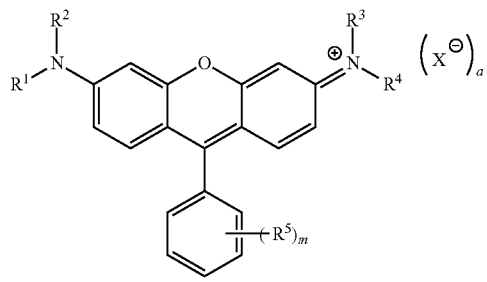

wherein:
$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of halogen, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;
$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;
m is an integer ranging from 0 to 5, a plurality of $R^5$s being the same or different when m is from 2 to 5;
X represents halogen;
a is 0 or 1;
$R^6$ is a $C_1$-$C_{10}$ alkyl group unsubstituted or substituted with halogen; wherein —$CH_2$— contained in said $C_1$-$C_{10}$ alkyl group is un-replaced or replaced with —O—, carbonyl, or —$NR^7$—;

$R^7$ is a $C_1$-$C_{10}$ alkyl group unsubstituted or substituted with halogen;
$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein the hydrogen in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —OH, halogen, -Q, —$CH=CH_2$, and —$CH=CH$—$R^6$; and the —$CH_2$— in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —O—, carbonyl, and —$NR^7$—; or
$R^8$ and $R^9$ join together to form a $C_1$-$C_{10}$ heterocyclic group; wherein the hydrogen in the $C_1$-$C_{10}$ heterocyclic group is unsubstituted or substituted with a substituent selected from the group consisting of $R^6$, —OH and -Q;
Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of halogen, —$R^6$, —OH, —$OR^6$, —$NO_2$, —$CH=CH_2$, and —$CH=CH$—$R^6$, and a $C_5$-$C_{10}$ heteroaryl group substituted with a substituent selected from the group consisting of halogen, —$R^6$, —OH, —$OR^6$, —$NO_2$, —$CH=CH_2$, and —$CH=CH$—$R^6$; and
M is selected from the group consisting of potassium and sodium.

Preferably, examples of the $R^6$ include, but are not limited to, methyl, ethyl, propyl, isopropyl, butyl, isobutyl, pentyl, isopentyl, neopentyl, cyclopentyl, hexyl, cyclohexyl, heptyl, cycloheptyl, octyl, cyclooctyl, 2-ethylhexyl, nonyl, decyl, tricycle(5.3.0.0$^{3,10}$)decanyl, methoxypropyl, hexyloxypropyl, 2-ethylhexyloxypropyl, methoxyhexyl, and epoxypropyl.

Preferably, examples of the $C_6$-$C_{10}$ aryl group include, but are not limited to, phenyl and naphthyl.

Preferably, examples of —$SO_3R^6$ include, but are not limited to, methanesulfonyl, ethanesulfonyl, hexanesulfonyl, and decanesulfonyl.

Preferably, examples of —$COOR^6$ include, but are not limited to, methoxycarbonyl, ethoxycarbonyl, propoxycarbonyl, iso-propoxycarbonyl, butoxycarbonyl, iso-butoxycarbonyl, pentoxycarbonyl, iso-pentoxycarbonyl, neo-pentoxycarbonyl, cyclopentoxycarbonyl, hexoxycarbonyl, cyclohexoxycarbonyl, heptoxycarbonyl, cycloheptoxycarbonyl, octoxycarbonyl, cyclooctoxycarbonyl, 2-ethylhexoxycarbonyl, nonoxycarbonyl, decoxycarbonyl, tricycle(5.3.0.0$^{3,10}$)decylcarbonyl, methoxypropoxycarbonyl, hexoxypropoxycarbonyl, 2-ethylhexoxypropoxycarbonyl, and methoxyhexoxycarbonyl.

Preferably, examples of —$SO_2NHR^8$ include, but are not limited to, sulfamoyl, methylsulfamoyl, ethylsulfamoyl, propylsulfamoyl, iso-propylsulfamoyl, butylsulfamoyl, iso-butylsulfamoyl, pentylsulfamoyl, iso-pentylsulfamoyl, neopentylsulfamoyl, cyclopentylsulfamoyl, hexylsulfamoyl, cyclohexylsulfamoyl, heptylsulfamoyl, cycloheptylsulfamoyl, octylsulfamoyl, cyclooctylsulfamoyl, 2-ethylhexylsulfamoyl, nonylsulfamoyl, decylsulfamoyl, tricycle(5.3.0.0$^{3,10}$)decylsulfamoyl, methoxypropylsulfamoyl, hexoxypropylsulfamoyl, 2-ethylhexoxypropylsulfamoyl, methoxyhexylsulfamoyl, epoxypropylsulfamoyl, 1,5-dimethylhexylsulfamoyl, propoxypropylsulfamoyl, iso-propoxypropylsulfamoyl, 3-phenyl-1-methylpropylsulfamoyl,

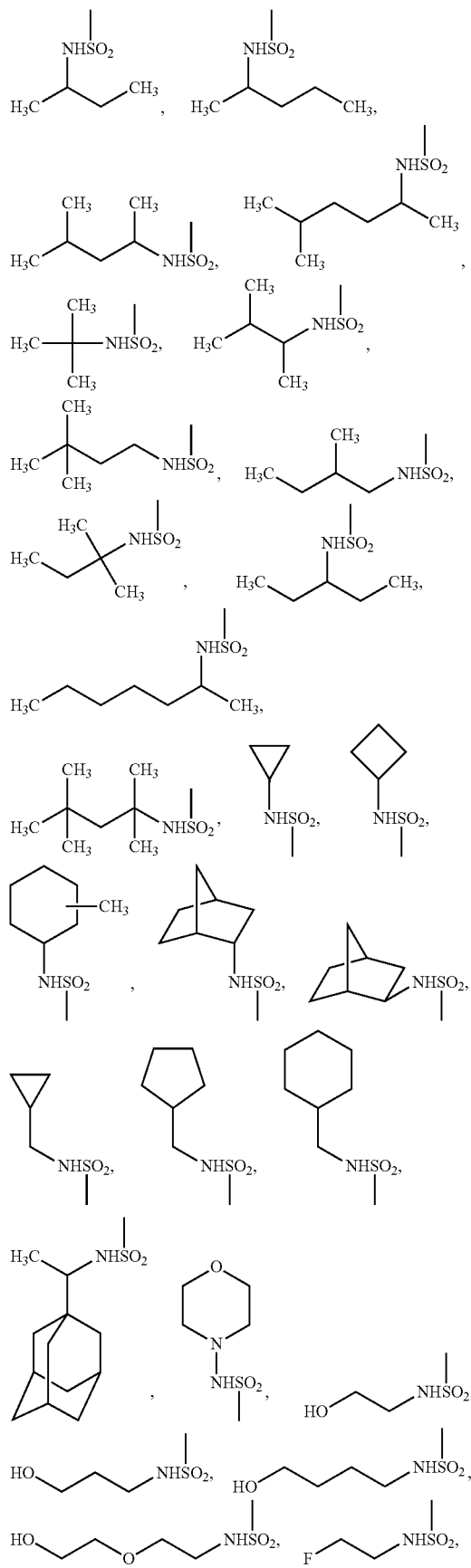
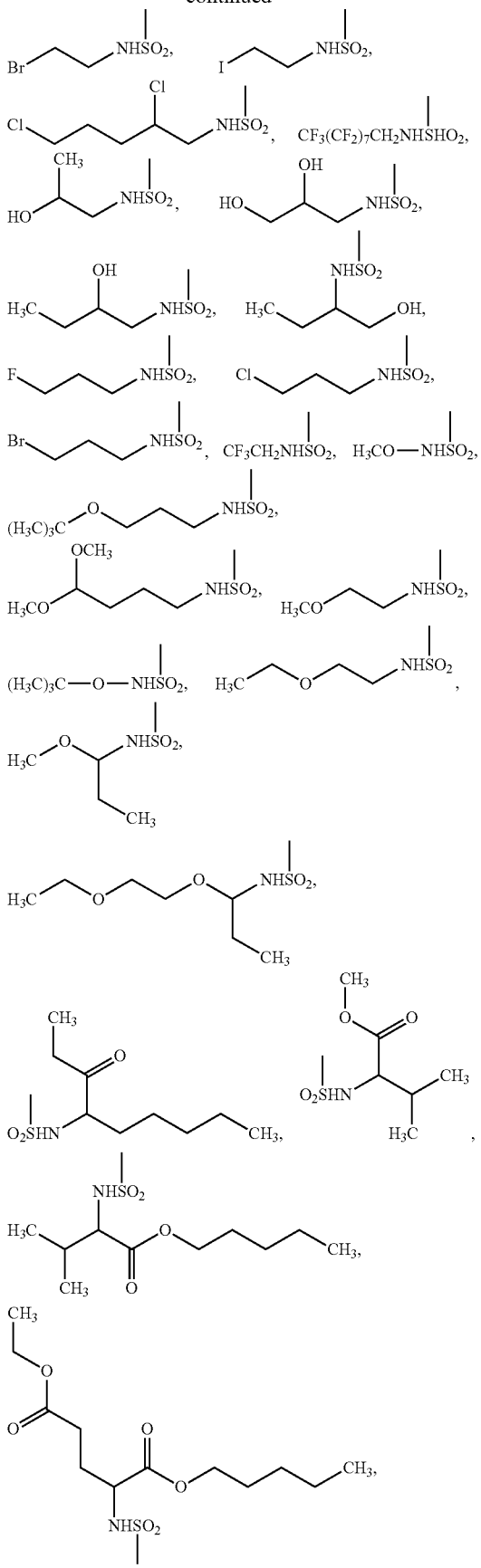

-continued
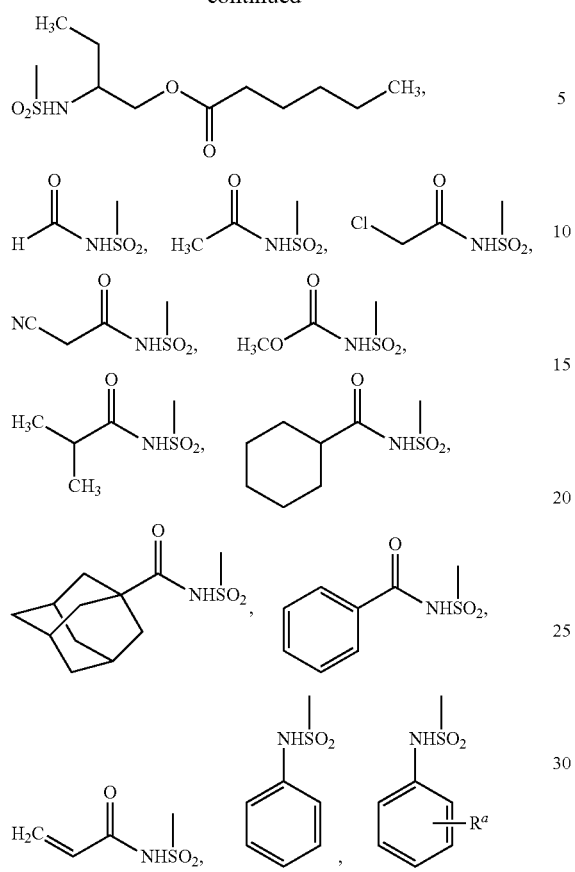
(wherein $R^a$ denotes a $C_1$-$C_3$ alkyl group and a $C_1$-$C_3$ alkoxy, which are independently unsubstituted or substituted with halogen),
-continued
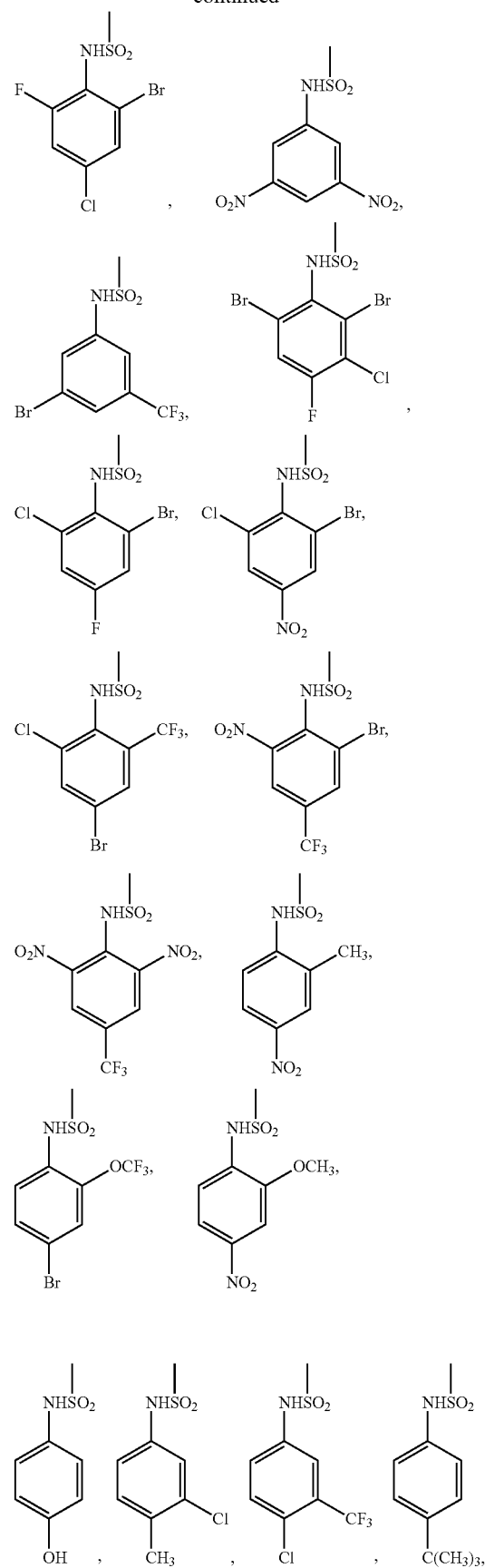

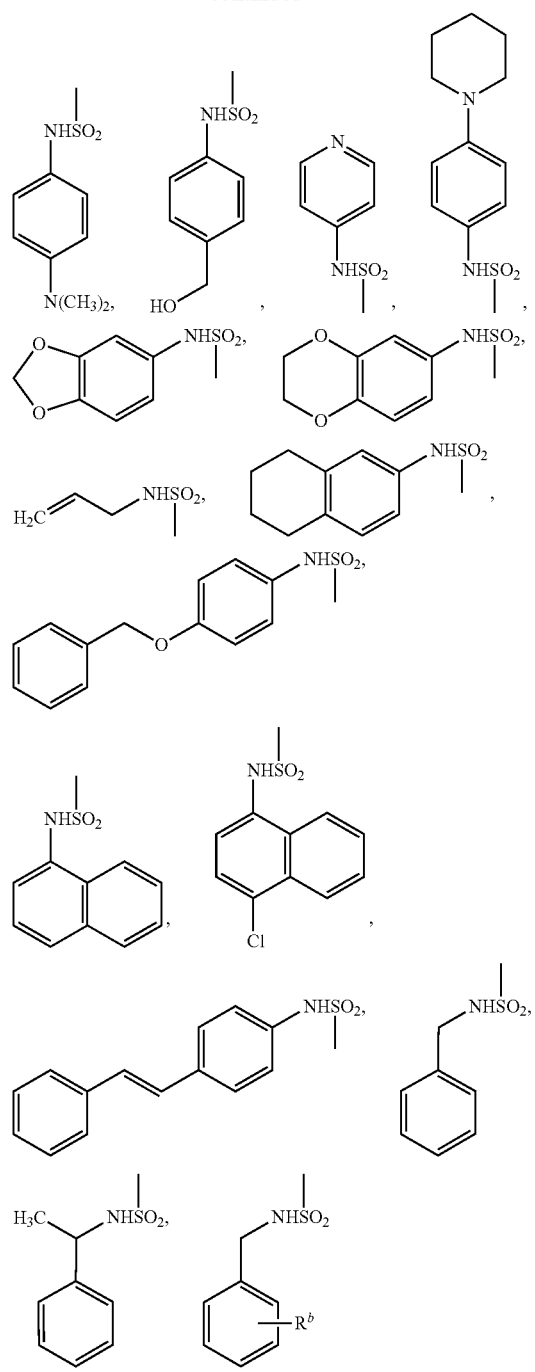
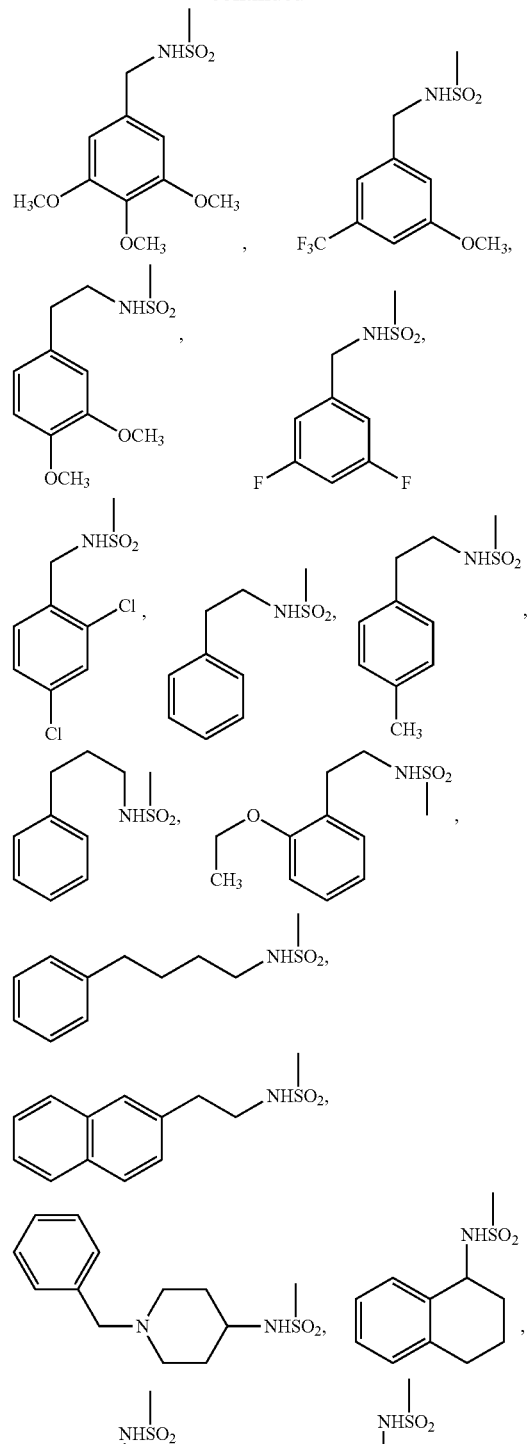
(wherein $R^b$ denotes a $C_1$-$C_3$ alkyl group and a $C_1$-$C_3$ alkoxy, which are independently unsubstituted or substituted with
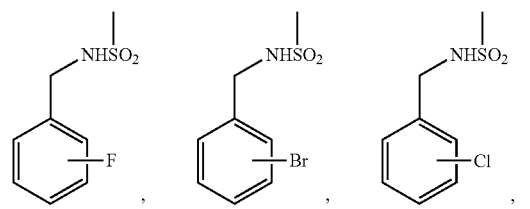
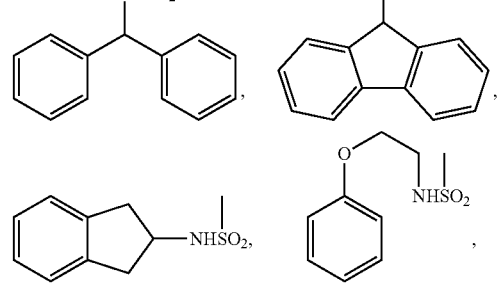

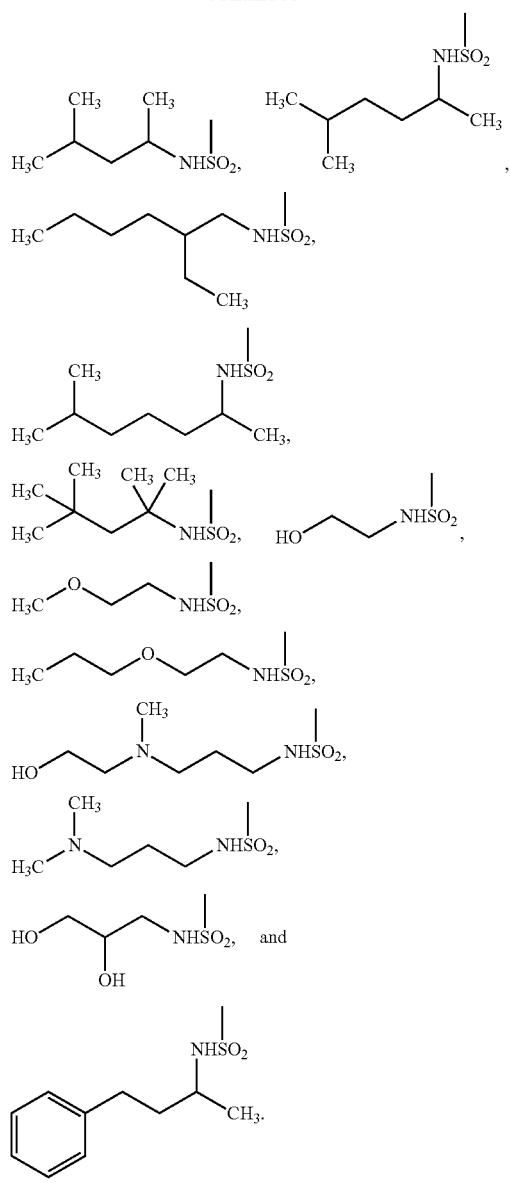
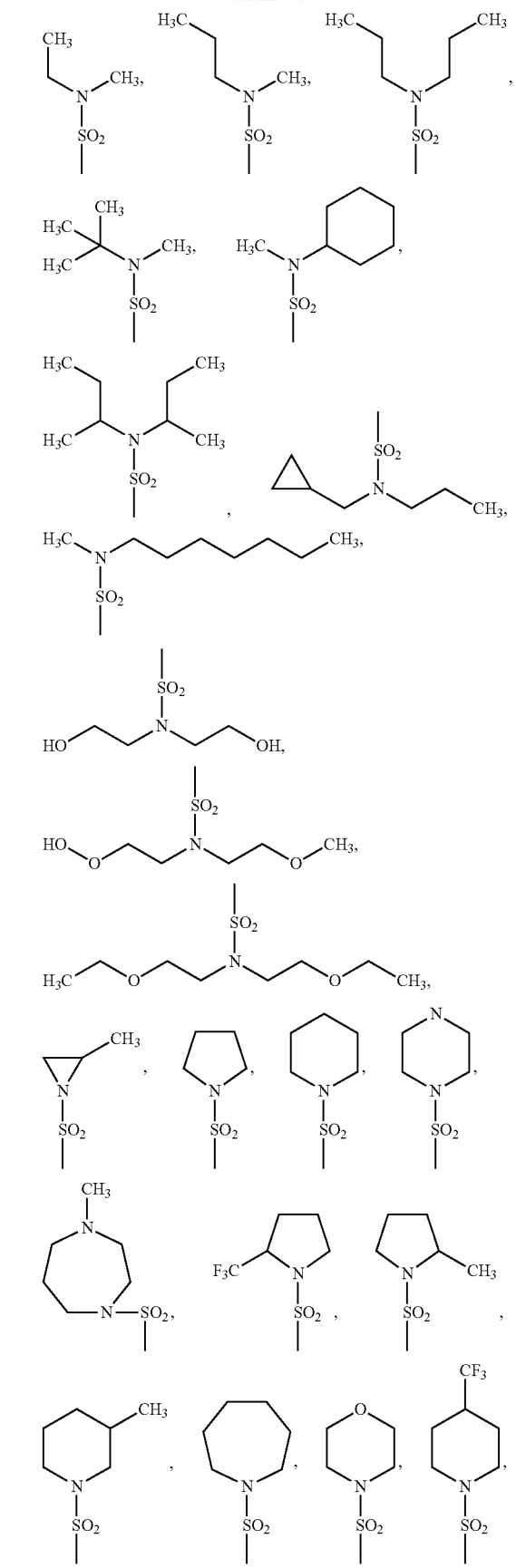
Preferably, examples of —SO$_2$NR$^8$R$^9$ include, but are not limited to,

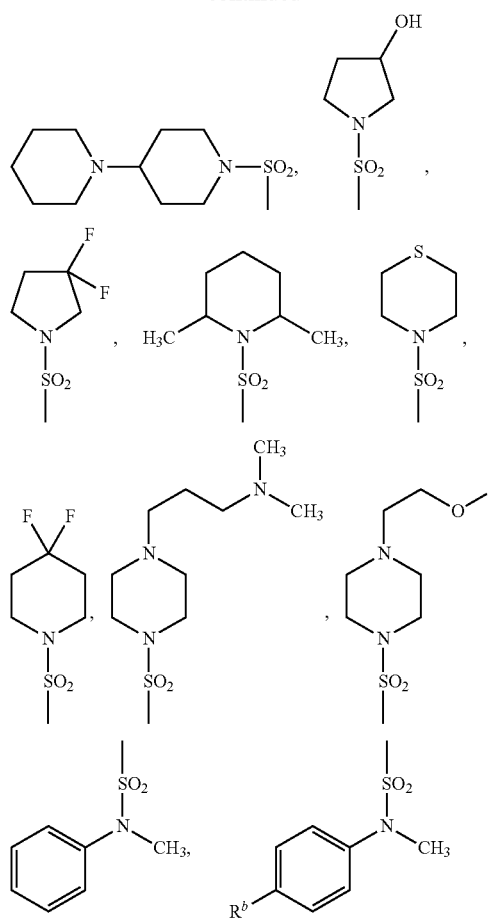
(wherein $R^b$ denotes a $C_1$-$C_3$ alkyl group and a $C_1$-$C_3$ alkoxy which are independently unsubstituted or substituted with halogen),
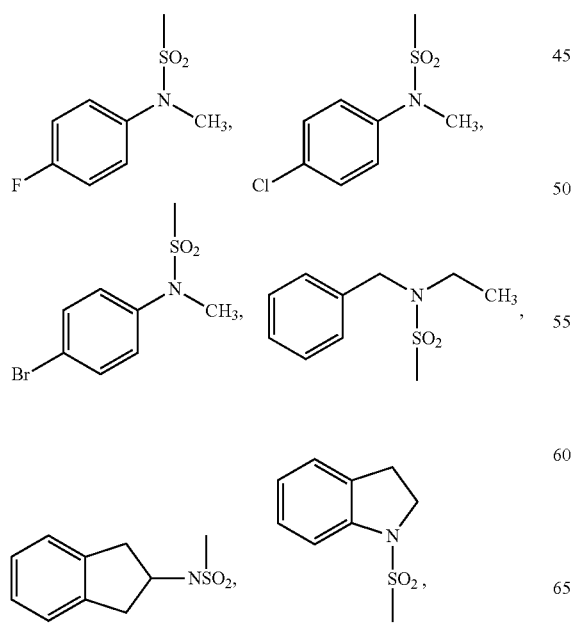
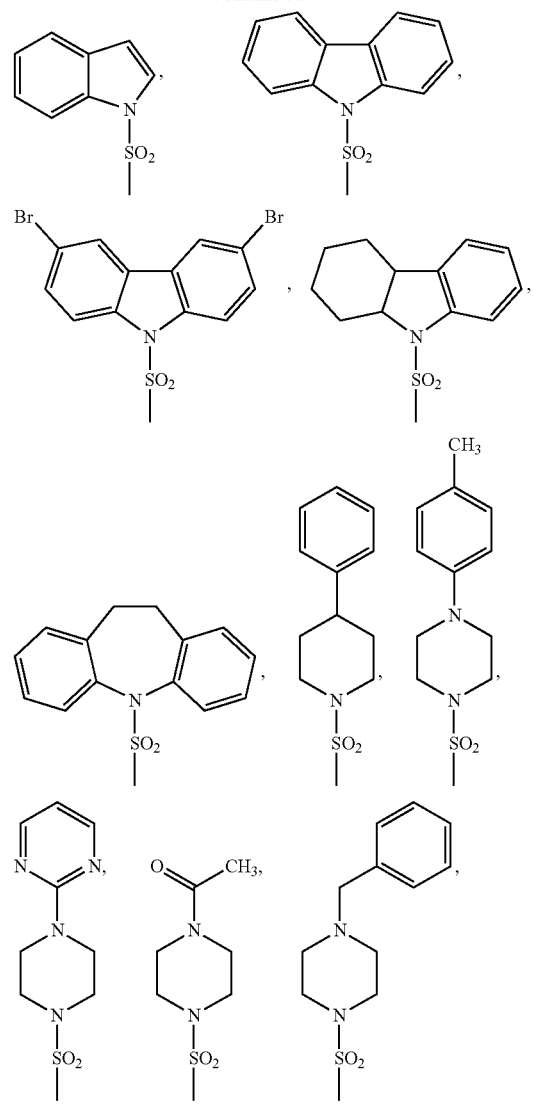

-continued

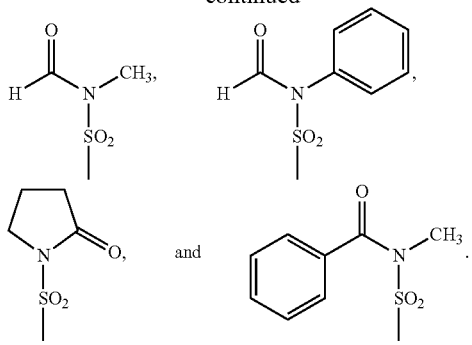

Preferably, the dye (B) includes a red dye represented by Formula (I-1)

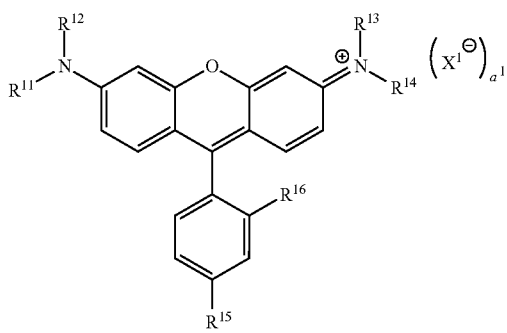

Formula (I-1)

wherein:
$R^{11}$, $R^{12}$, $R^{13}$, and $R^{14}$ are independently selected from the group consisting of hydrogen, —$R^6$, and a $C_6$-$C_{10}$ aryl group, said $C_6$-$C_{10}$ aryl group being unsubstituted or substituted with a substituent selected from the group consisting of halogen, —$R^6$, —OH, —$OR^6$, —$SO_3^-$, —$SO_3H$, —$SO_3Na$, —COOH, —$COOR^6$, —$SO_3R^6$, —$SO_2NHR^8$, and —$SO_2NR^8R^9$;
$R^{15}$ is selected from the group consisting of hydrogen, —$SO_3^-$, —$SO_3H$, —$SO_2NHR^8$, and —$SO_2NR^8R^9$;
$R^{16}$ is selected from the group consisting of —$SO_3^-$, —$SO_3H$, —$SO_2NHR^8$, and —$SO_2NR^8R^9$;
$X^1$ is halogen; and
$a^1$ is 0 or 1.
Preferably, the dye (B) includes a red dye represented by Formula (I-2),

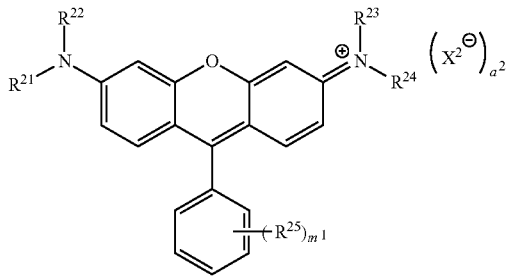

Formula (I-2)

wherein:
$R^{21}$, $R^{22}$, $R^{23}$, and $R^{24}$ are independently selected from the group consisting of hydrogen, —$R^{26}$, and a $C_6$-$C_{10}$ aryl group unsubstituted or substituted with a substituent selected from the group consisting of halogen, —$R^{26}$, —OH, —$OR^{26}$, —$SO_3^-$, —$SO_3H$, —$SO_3Na$, —COOH, —$COOR^{26}$, $SO_3R^{26}$, and —$SO_2NHR^{28}$;
$R^{25}$ is selected from the group consisting of —$SO_3^-$, —$SO_3Na$, —COOH, —$COOR^{26}$, —$SO_3H$, and —$SO_2NHR^{28}$;
$m^1$ is an integer ranging from 0 to 5, a plurality of $R^{25}$s being the same or different when $m^1$ is from 2 to 5;
$X^2$ represents halogen;
$a^2$ is 0 or 1;
$R^{26}$ is a $C_1$-$C_{10}$ alkyl group unsubstituted or substituted with a substituent selected from the group consisting of halogen and —$OR^{27}$;
$R^{27}$ is a $C_1$-$C_{10}$ alkyl group; and
$R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

Preferably, the dye (B) includes a red dye represented by Formula (I-3),

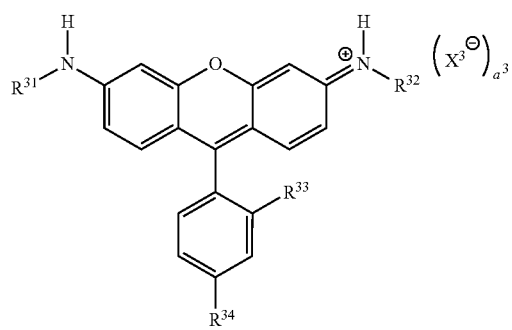

Formula (I-3)

wherein:
$R^{31}$ and $R^{32}$ are independently phenyl unsubstituted or substituted with a substituent selected from the group consisting of halogen, —$R^{26}$, —$OR^{26}$, —$COOR^{26}$, —$SO_3R^{26}$, and —$SO_2NHR^{28}$;
$R^{33}$ is selected from the group consisting of —$SO_3^-$ and —$SO_2NHR^{28}$;
$R^{34}$ is selected from the group consisting of hydrogen, —$SO_3^-$, and —$SO_2NHR^{28}$;
$X^3$ is halogen;
$a^3$ is 0 or 1;
$R^{26}$ is a $C_1$-$C_{10}$ alkyl group unsubstituted or substituted with a substituent selected from the group consisting of halogen and —$OR^{27}$;
$R^{27}$ is a $C_1$-$C_{10}$ alkyl group; and
$R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

Preferably, the dye (B) includes a red dye represented by Formula (I-4):

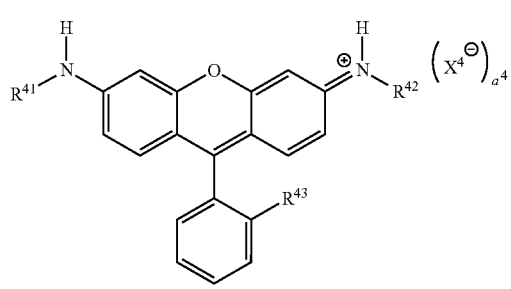

Formula (I-4)

wherein:
- $R^{41}$ and $R^{42}$ are independently phenyl unsubstituted or substituted with a substituent selected from the group consisting of —$R^{26}$ and —$SO_2NHR^{28}$;
- $R^{43}$ is selected from the group consisting of —$SO_3^-$ and —$SO_2NHR^{28}$;
- $X^4$ is halogen;
- $a^4$ is 0 or 1;
- $R^{26}$ is $C_1$-$C_{10}$ alkyl group unsubstituted or substituted with a substituent selected from the group consisting of halogen and —$OR^{27}$;
- $R^{27}$ is a $C_1$-$C_{10}$ alkyl group; and
- $R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

In one preferred embodiment, examples the dye (B) include, but are not limited to, the following Formulae (1) to (31):

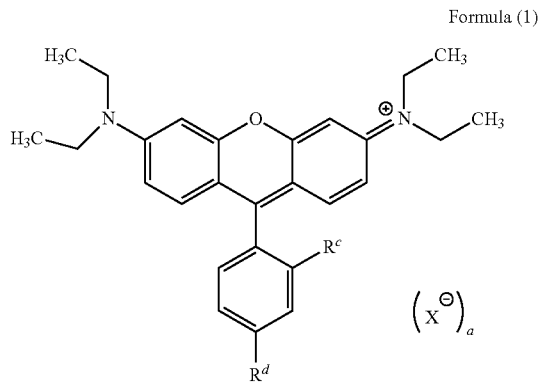

Formula (1)

wherein:
- $R^c$ and $R^d$ are independently selected from the group consisting of hydrogen, —$SO_3^-$, —COOH, and —$SO_2NHR^{81}$;
- $R^{81}$ represents 2-ethylhexyl;
- X represents halogen; and
- a is 0 or 1.

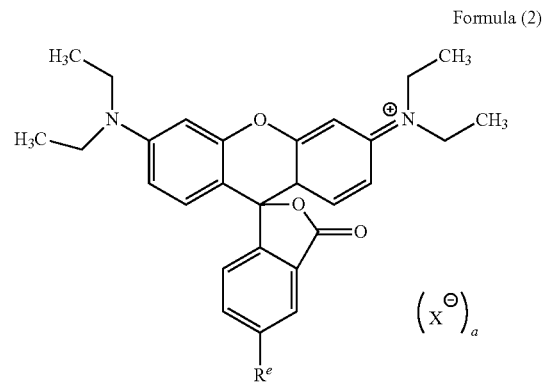

Formula (2)

wherein:
- $R^e$ is selected from the group consisting of hydrogen, —$SO_3^-$, —COOH, and —$SO_2NHR^{81}$;
- $R^{81}$ represents 2-ethylhexyl;
- X represents halogen; and
- a is 0 or 1.

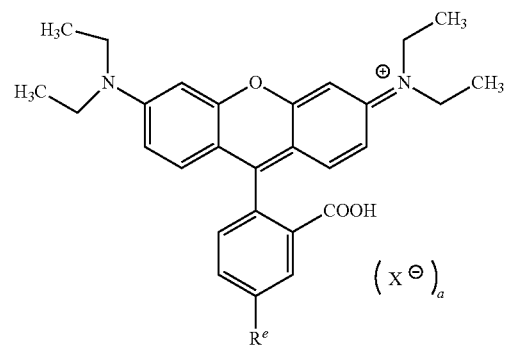

Formula (3)

wherein:
- $R^e$ is selected from the group consisting of hydrogen, —$SO_3^-$, —COOH, and —$SO_2NHR^{81}$;
- $R^{81}$ represents 2-ethylhexyl;
- X represents halogen; and
- a is 0 or 1.

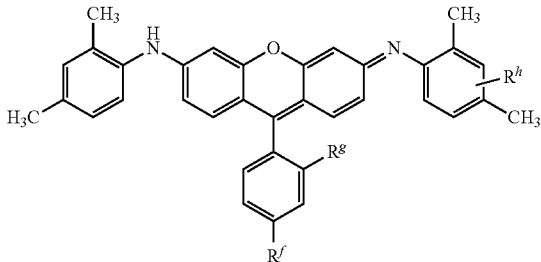

Formula (4)

wherein:
- $R^f$, $R^g$, and $R^h$ are independently selected from the group consisting of —$SO_3^-$, —$SO_3Na$, and —$SO_2NHR^{81}$; and
- $R^{81}$ represents 2-ethylhexyl.

Formula (5)

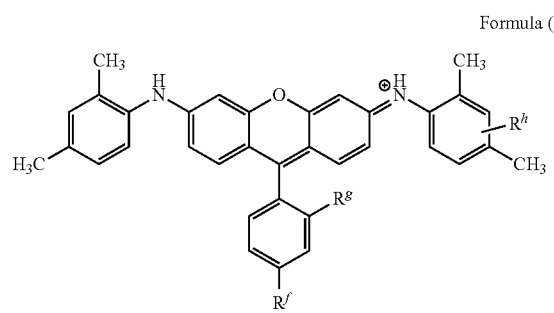

wherein:

$R^f$, $R^g$, and $R^h$ are independently selected from the group consisting of —$SO_3^-$, —$SO_3Na$, and —$SO_2NHR^{81}$; and $R^{81}$ represents 2-ethylhexyl.

Formula (6)

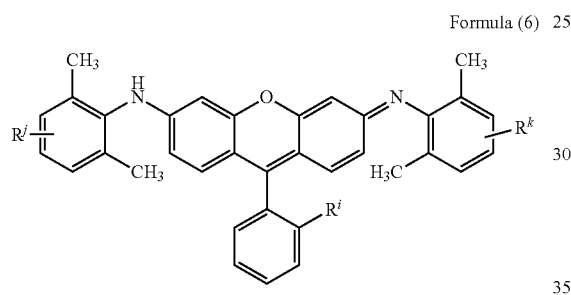

wherein:

$R^i$, $R^j$, and $R^k$ are independently selected from the group consisting of hydrogen, —$SO_3^-$, —$SO_3H$, and —$SO_2NHR^{81}$; and $R^{81}$ represents 2-ethylhexyl.

Formula (7)

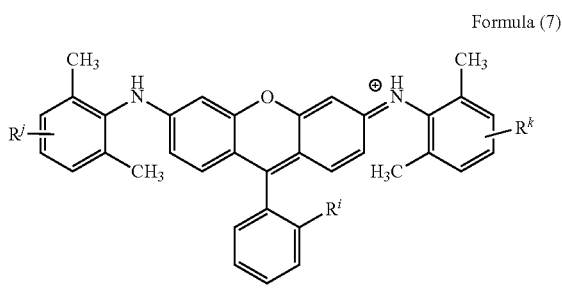

wherein:

$R^i$, $R^j$, and $R^k$ are independently selected from the group consisting of hydrogen, —$SO_3^-$, —$SO_3H$, and —$SO_2NHR^{81}$; and $R^{81}$ represents 2-ethylhexyl.

Formula (8)

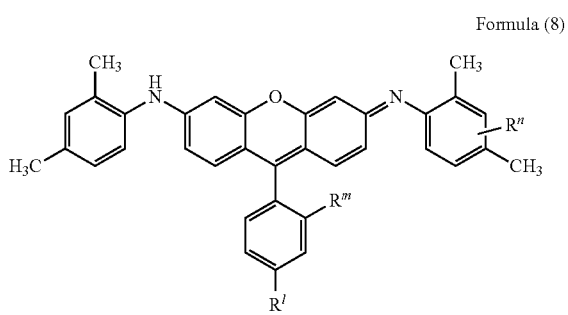

wherein:

$R^l$, $R^m$, and $R^n$ are independently selected from the group consisting of —$SO_3^-$, —$SO_3Na$, and —$SO_2NHR^{81}$; and $R^{81}$ represents 2-ethylhexyl.

Formula (9)

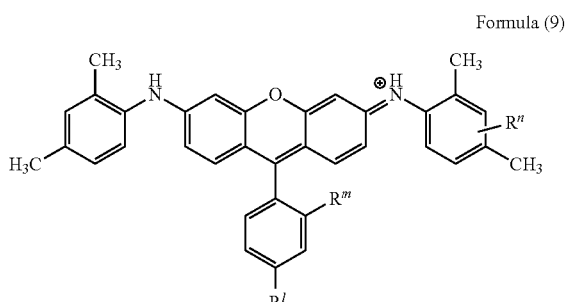

wherein:

$R^l$, $R^m$, and $R^n$ are independently selected from the group consisting of —$SO_3^-$, —$SO_3Na$, and —$SO_2NHR^{81}$; and $R^{81}$ represents 2-ethylhexyl.

Formula (10)

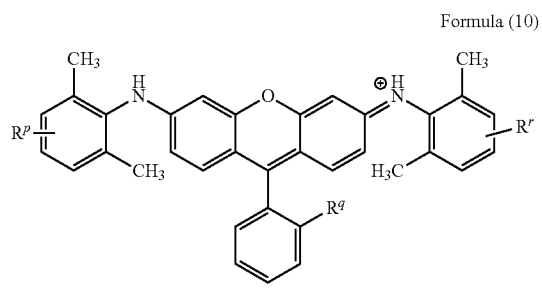

wherein:

$R^p$, $R^q$, and $R^r$ are independently selected from the group consisting of hydrogen, —$SO_3^-$, —$SO_3H$, and —$SO_2NHR^{81}$; and $R^{81}$ represents 2-ethylhexyl.

Formula (11)
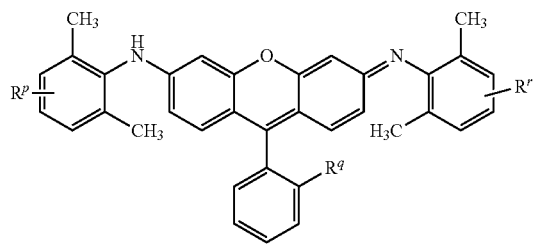
wherein:
$R^p$, $R^q$, and $R^r$ are independently selected from the group consisting of hydrogen, —$SO_3^-$, —$SO_3H$, and —$SO_2NHR^{81}$; and
$R^{81}$ represents 2-ethylhexyl.
Formula (12)
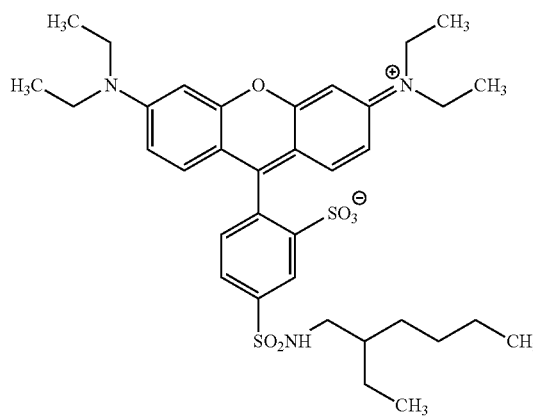
Formula (13)
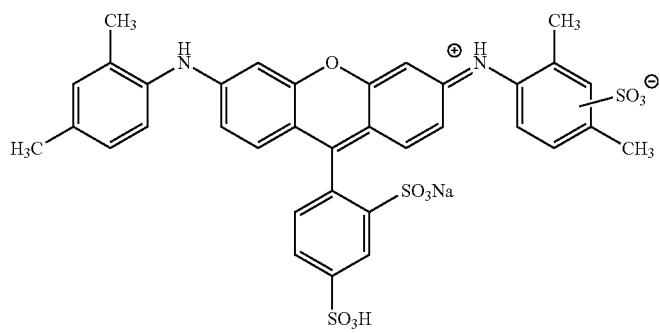
Formula (14)
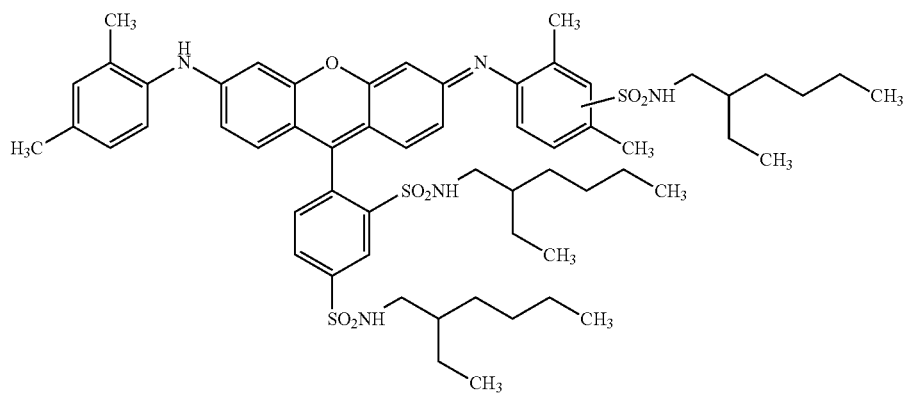

-continued
Formula (15)
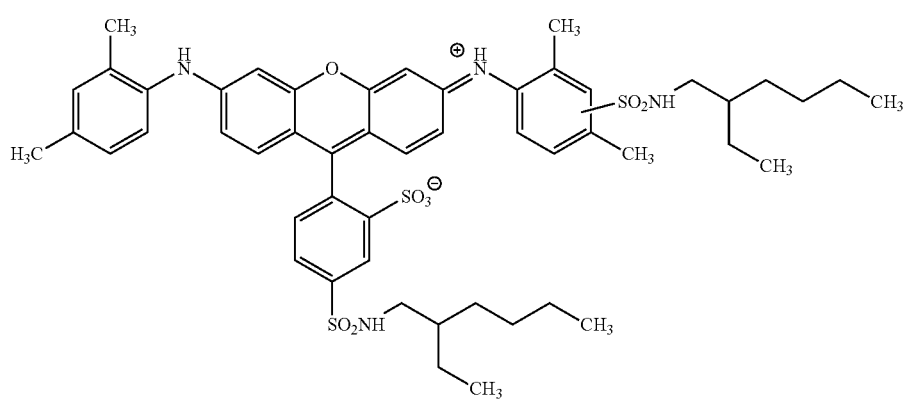
Formula (16)
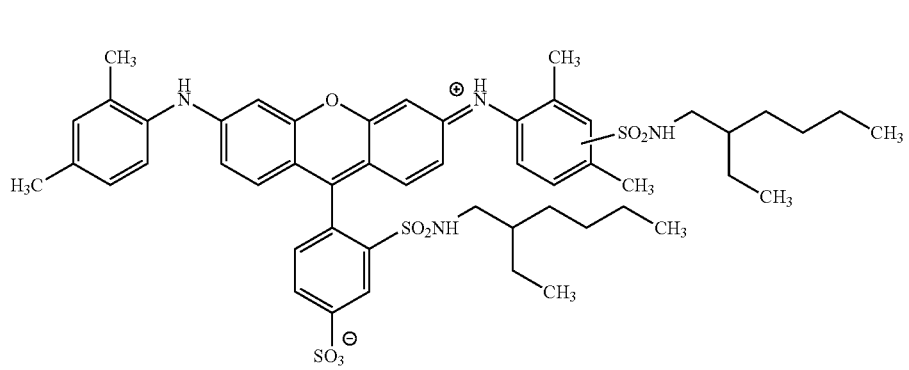
Formula (17)
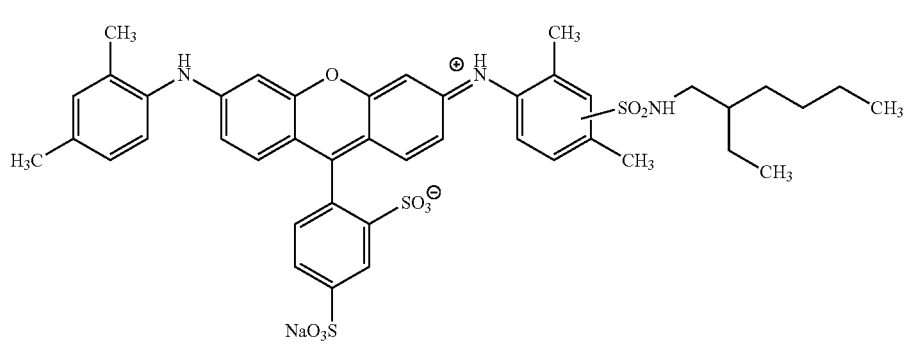
Formula (18)
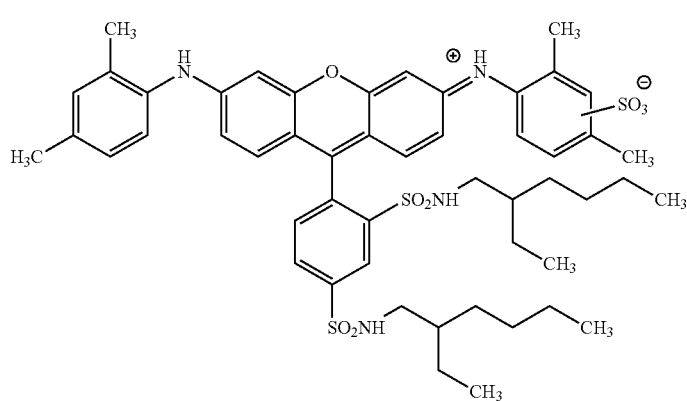

Formula (19)
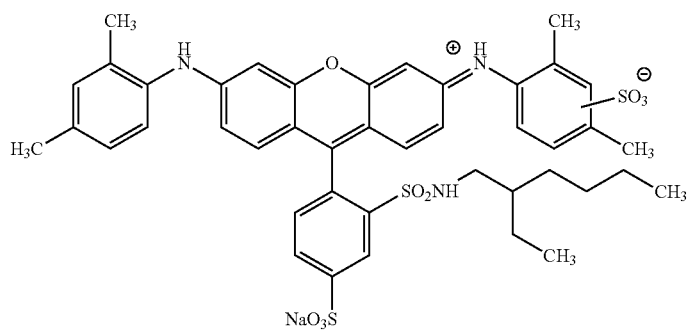
Formula (20)
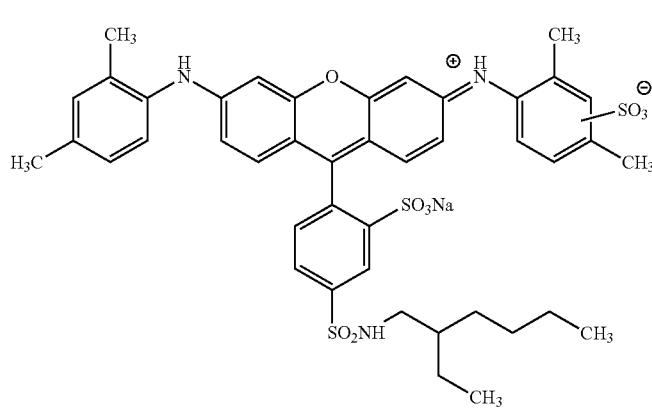
Formula (21)
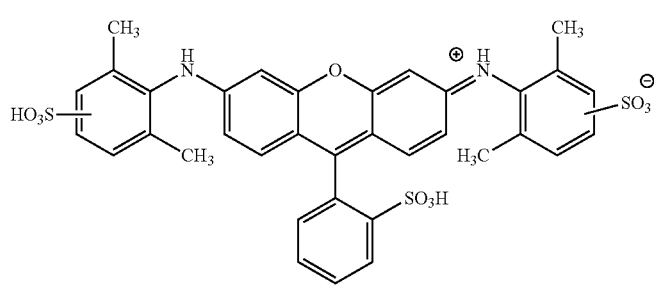
Formula (22)
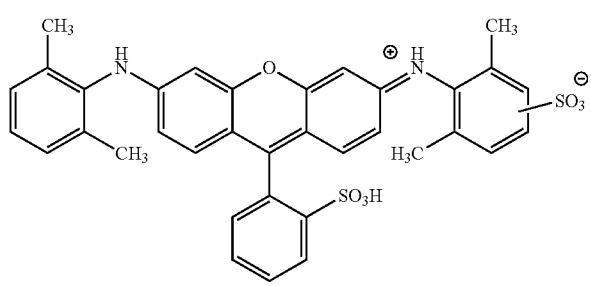
Formula (23)
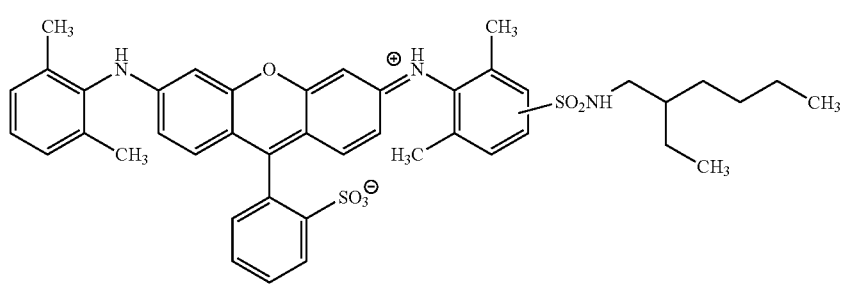

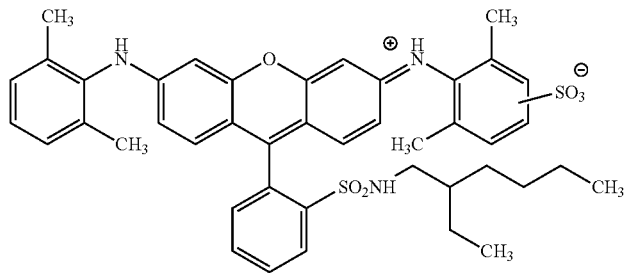
Formula (24)
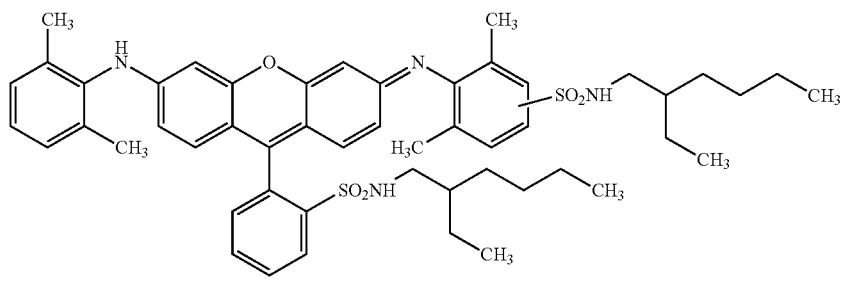
Formula (25)
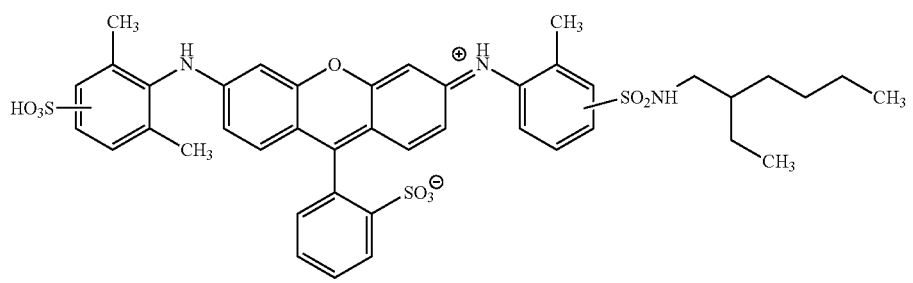
Formula (26)
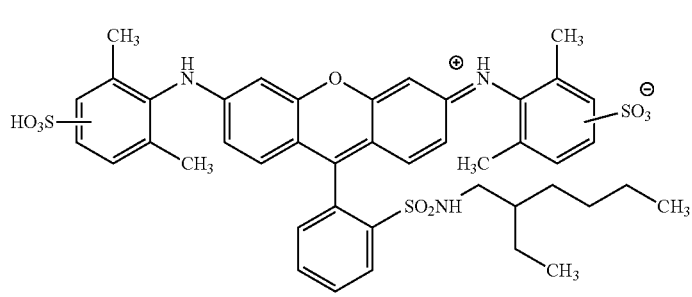
Formula (27)
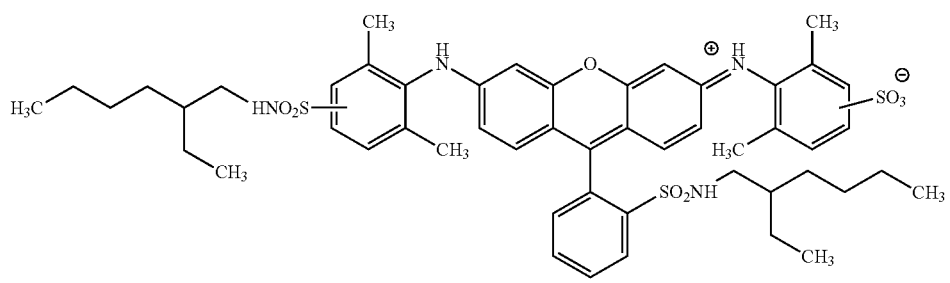
Formula (28)

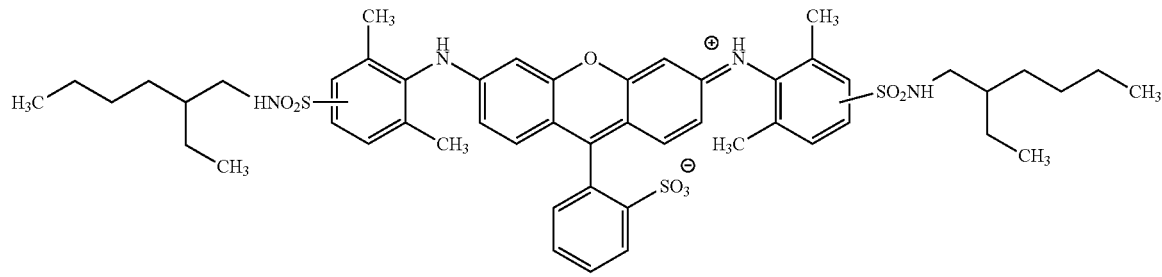

Formula (29)

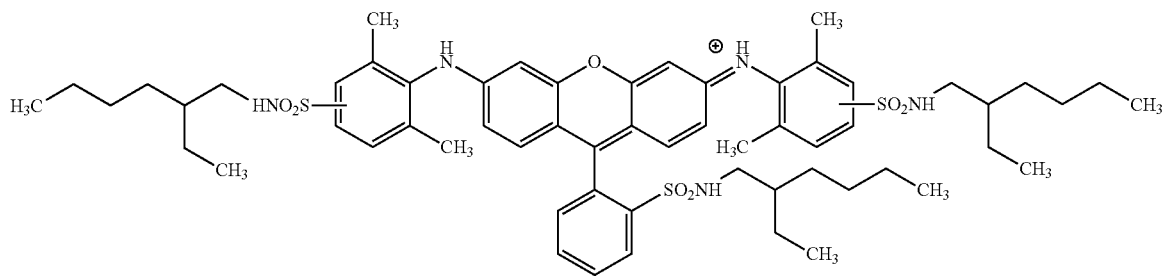

Formula (30)

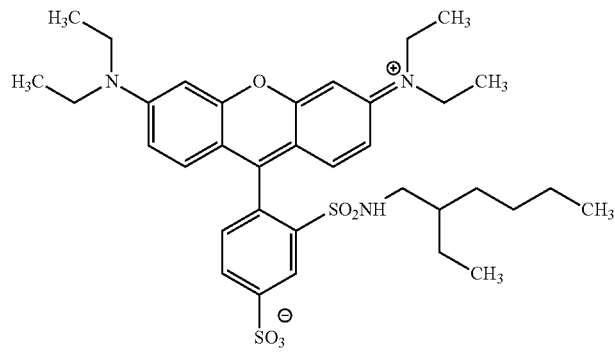

Formula (31)

Preferred examples of the dye (B) include the compound of formula (1) where $R^c$ and $R^d$ are $—SO_3^-$ and a is 0 (such as C.I. Acid Red 52), the compound of Formula (22) (such as C.I. Acid Red 289), the compound of Formula (28), the compound of Formula (31), and combinations thereof.

In one embodiment of the invention, the used amount of the dye (B) is from 5 to 50 parts by weight based on 100 parts by weight of the used amount of the alkali-soluble resin (C); preferably from 6 to 45 parts by weight; more preferably from 7 to 40 parts by weight.

The alkali-soluble resin (C) according to the invention is obtained by subjecting an ethylenically unsaturated monomer having one or more carboxyl groups and another copolymerizable ethylenically unsaturated monomer to conduct a copolymerization. Preferably, the amounts of the ethylenically unsaturated monomer having one or more carboxyl groups and the another copolymerizable ethylenically unsaturated monomer used in the copolymerization reaction are 50-95 wt % and 5-50 wt %, respectively.

Examples of the ethylenically unsaturated monomer having one or more carboxyl groups can be used alone or in admixture of two or more thereof, and include, but are not limited to, unsaturated monocarboxylic acids, such as acrylic acid, methacrylic acid, butenoic acid, α-chloroacrylic acid, ethacrylic acid, cinnamic acid, 2-acryloylethoxy succinate, 2-methacryloylethoxy succinate, or the like; unsaturated dicarboxylic acids and/or anhydrides thereof, such as maleic acid, maleic anhydride, fumaric acid, itaconic acid, itaconic anhydride, citraconic acid, citraconic anhydride, or the like; and unsaturated polycarboxylic acids having at least three carboxyl groups in the molecules and/or anhydrides thereof. Preferably, the ethylenically unsaturated monomer having one or more carboxyl groups is selected from acrylic acid, methacrylic acid, 2-acryloylethoxy succinate, and 2-methacryloylethoxy succinate. More preferably, the ethylenically unsaturated monomer having one or more carboxyl groups is selected from 2-acryloylethoxy succinate and 2-methacryloylethoxy succinate. The ethylenically unsaturated monomer having one or more carboxyl groups is used for increasing the pigment dispersion, enhancing the development speed, and reducing the residue.

Examples of the another copolymeriable ethylenically unsaturated monomer can be used alone or in admixture of two or more thereof, and include, but are not limited to, vinyl aromatic compounds, such as styrene, α-methyl styrene, vinyl toluene, p-chlorostyrene, methoxystyrene, or the like; maleimides, such as N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide, or the like; unsaturated carboxylates, such as methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate, dicyclopentenyloxyethyl acrylate, or the like; N,N-dimethyl aminoethyl acrylate, N,N-dimethyl aminoethyl methacrylate, N,N-diethyl aminopropyl acrylate, N,N-dimethyl aminopropyl methacrylate, N,N-dibutyl aminopropyl acrylate, isobutylaminoethyl N-methylacrylate, or the like; unsaturated glycidyl carboxylates, such as glycidyl acrylate, glycidyl methacrylate, or the like; vinyl carboxylates, such as vinyl acetate, vinyl propionate, vinyl butyrate, or the like; unsaturated ethers, such as vinyl methyl ether, vinyl ethyl ether, allyl glycidyl ether, methallyl glycidyl ether, or the like; vinyl cyanides, such as acrylonitrile, methyl acrylonitrile, α-chloroacrylonitrile, vinylidene cyanide, or the like; unsaturated amides, such as acrylamide, methacrylamide, α-chloroacrylamide, N-hydroxyethyl acrylamide, N-hydroxyethyl methacrylamide, or the like; and aliphatic conjugate dienes, such as 1,3-butadiene, isoprene, chloroprene, or the like.

Preferably, the another copolymerizable ethylenically unsaturated monomer is selected from styrene, N-phenylmaleimide, methyl acrylate, methyl methacrylate, 2-hydroxyethyl acrylate, 2-hydroxyethyl methacrylate, benzyl acrylate, benzyl methacrylate, dicyclopentenyloxyethyl acrylate, and combinations thereof.

When preparing the alkali-soluble resin (C), a solvent can be used. Examples of the solvent suitable for preparing the alkali-soluble resin (C) can be used alone or in admixture of two or more thereof, and include, but are not limited to, (poly)alkylene glycol monoalkyl ethers, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, tripropylene glycol ethyl ether, or the like; (poly)alkylene glycol monoalkyl ether acetates, such as ethylene glycol methyl ether acetate, ethylene glycol ethyl ether acetate, propylene glycol methyl ether acetate, propylene glycol ethyl ether acetate, or the like; other ethers, such as diethylene glycol dimethyl ether, diethylene glycol methyl ethyl ether, diethylene glycol diethyl ether, tetrahydrofuran, or the like; ketones, such as methyl ethyl ketone, cyclohexanone, 2-heptanone, 3-heptanone, or the like; alkyl lactate, such as methyl 2-hydroxypropionate, ethyl 2-hydroxypropionate, or the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, iso-butyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-methoxybutyrate, or the like; aromatic hydrocarbons, such as toluene, xylene, or the like; and carboxylic acid amide, such as N-methyl-2-pyrrolidone, N,N-dimethylformamide, N,N-dimethylacetamide, or the like. Preferably, the solvent is selected from propylene glycol methyl ether acetate, ethyl 3-ethoxypropionate, and a combination thereof. Examples of the (poly)alkylene glycol monoalkyl ethers include alkylene glycol monoalkyl ethers and polyalkylene glycol monoalkyl ethers. Examples of the (poly)alkylene glycol monoalkyl ether acetates include alkylene glycol monoalkyl ether acetates and polyalkylene glycol monoalkyl ether acetates.

An initiator used for preparing the alkali-soluble resin (C) is a free radical polymerization initiator, examples of which include, but are not limited to, azo compounds, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methylbutyronitrile, or the like; and peroxides, such as benzoyl peroxide, or the like.

The blue photosensitive resin composition for a color filter according to the invention comprises the cationic polymeric compound (D). If the cationic polymeric compound (D) is absent, the developing-resistance and ageing stability of sensitivity are poor.

In one embodiment of the invention, the used amount of the cationic polymeric compound (D) is from 20 to 200 parts by weight based on 100 parts by weight of the used amount of the alkali-soluble resin (C); preferably from 25 to 180 parts by weight; more preferably from 30 to 160 parts by weight.

In one preferred embodiment of the invention, the cationic polymeric compound (D) comprises an oxetane compound (D-1).

Examples of the oxetane compound (D-1) are trimethylene oxide, 3,3-dimethyl oxetane, 3,3-dichloro-methyl oxetane, 3-ethyl-3-phenoxymethyl oxetane, 3-ethyl-3-hydroxymethyloxetane, 1,4-bis{[(3-ethyloxetan-3-yl)methoxy]methyl}benzene, bis[1-ethyl(3-oxetanyl)]methyl ether, 3-ethyl-3-(2-ethyl xylo carboxymethyl)oxetane, 3-ethyl-3-(cyclohexyloxy)methyloxetane, 1,3-bis[(3-ethyloxetan-3-yl)methoxy]benzene, or derives thereof such as OXT-121 (Formula (32)), OXT-213 (Formula (33)), OXT-221 (Formula (34)), OXT-101 (Formula (35)), OXT-212 (Formula (36)) (all manufactured by Toagosei Company, Limited).

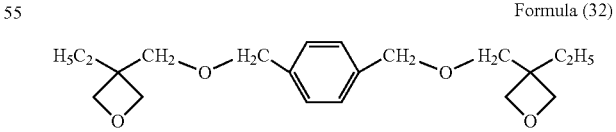

Formula (32)

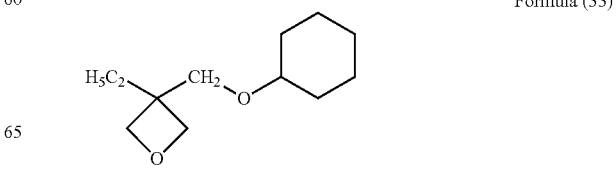

Formula (33)

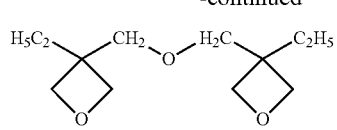

Formula (34)

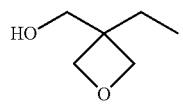

Formula (35)

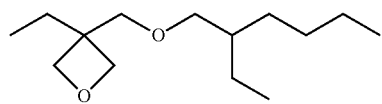

Formula (36)

When using the oxetane compound (D-1), the ageing stability of sensitivity is improved.

In one preferred embodiment of the invention, the cationic polymeric compound (D) comprises an other cationic polymeric compound (D-2). Examples of the other cationic polymeric compound (D) include but is not limited to an epoxy compound, oxolane compound, cyclic acetal compound, cyclic lactone compound, thiirane compound, thietane compound, spiroorthoester compound formed by reacting a lactone compound and an epoxy compound, vinyl ether compound, or other compound having an ethylenically unsaturated group.

Examples of the epoxy compound include but is not limited to bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxy cyclohexane carboxylate, 2-(3,4-epoxy cyclohexyl-5,5-spiro-3,4-epoxy) cyclohexane-meta-dioxane, bis(3,4-epoxycyclohexylmethyl) adipate, bis(3,4-epoxy-6-methylcyclohexylmethyl) adipate, 3,4-epoxy-6-methyl-3',4'-epoxy-6'-methylcyclohexane carboxylate, ε-caprolactone-modified 3,4-epoxycyclohexylmethyl-3'3,4,4'-epoxy cyclohexane carboxylate, trimethylcaprolactone-modified epoxycyclohexylmethyl-3',4'-epoxy cyclohexane carboxylate, β-methyl-δ-valerolactone-modified 3,4-epoxycyclohexylmethyl-3',4'-epoxy cyclohexane carboxylate, methylenebis (3,4-epoxycyclohexane), ethylene glycol of di (3,4-epoxycyclohexylmethyl) ether, ethylene bis(3,4-epoxy cyclohexane carboxylate), epoxy cyclo hexahydro di-n-octyl phthalate, epoxy cyclo hexahydro di-2-ethylhexyl phthalate, 1,4-butanediol diglycidyl ether), 1,6-hexanediol diglycidyl ether, neopentyl glycol diglycidyl ether, trimethylolpropane triglycidyl ether, polyethylene glycol diglycidyl ether, glycerol triglycidyl ether, polypropylene glycol diglycidyl ether, polyglycidyl ethers of polyether polyol obtained by adding an aliphatic polyol (such as ethylene glycol, propylene glycol, glycerin)) with one or more alkylene oxide, diglycidyl ester of a long-chain aliphatic dicarboxylic acid, monoglycidyl ether of an aliphatic higher alcohol, monoglycidyl ether of polyether alcohol obtained by adding oxyalkylenes (such as phenol, cresol, 4-n-butylphenol), glycidyl ester of higher fatty acid, epoxy butyl oleate, epoxy octyl oleate, epoxidized soybean oil, epoxidized linseed oil, and epoxidized polybutadiene, and derives thereof, Celoxide 2021P, CEL3000 (both manufactured by Daicel Chemical Ind., Ltd.).

Examples of the oxolane compound include but is not limited to tetrahydrofuran and 2,3-dimethyl tetrahydrofuran.

Examples of the cyclic acetal compound include but is not limited to trioxane, 1,3-dioxolane and 1,3,6-trioxane cyclooctane.

Examples of the cyclic lactone compound include but is not limited to β-propiolactone and ε-caprolactone.

Examples of the thiirane compound include but is not limited to ethylene sulfide, 1,2-propylene sulfide, and thio epichlorohydrin.

Examples of the thietane compound include but is not limited to 3,3,-dimethyl thietane.

Examples of the vinyl ether compound include but is not limited to ethylene glycol divinyl ether, triethylene glycol divinyl ether, and trimethylolpropane ether.

Examples of the other compound having an ethylenically unsaturated group include but is not limited to vinyl cyclohexane, isobutylene, and polybutadiene.

Examples of commercialized products of the other cationic polymeric compound (D-2) include but is not limited to TDVE (manufactured by Maruzen Petrochemical), TMPVE (manufactured by Nippon Carbide Industries Co., Inc), UVR-6100, UVR-6105, UVR-6110, UVR-6128, UVR-6200, UVR-6216 (all manufactured by Union Carbide), Celoxide 2021, Celoxide 2081, Celoxide 2083, Celoxide 2085, EPOLEAD GT-300, EPOLEAD GT-301, EPOLEAD GT-302, EPOLEAD GT-400, EPOLEAD GT-401, EPOLEAD GT-403 (all manufactured by Daicel Chemical Ind., Ltd), KRM-2100, KRM-2110, KRM-2199, KRM-2200, KRM-2400, KRM-2408, KRM-2410, KRM-2490, KRM-2720, KRM-2750 (all manufactured by ADEKA Co., Ltd), Rapi-cure DVE-3, CHVE, PEPC (all manufactured by ISP Ltd), EPICOAT 812, EPICOAT 828, EPICOAT 872, EPICOAT 1031, EPICOAT CT508 (all manufactured by Nippon Epoxy Resin Co.), VECOMER 2010, VECOMER 2020, VECOMER4010, VECOMER 4020 (all manufactured by Allied Signal).

In one embodiment of the invention, the used amount of the oxetane compound (D-1) is from 20 to 200 parts by weight based on 100 parts by weight of the used amount of the alkali-soluble resin (C); preferably from 25 to 180 parts by weight; more preferably from 30 to 160 parts by weight The cationic photoinitiator (E) according to the invention is a photoinitiator that produces an active substance under radiation rays such as visible light, ultraviolet, X-rays, α-rays, β-rays, and γ-rays to make the cationic polymeric compound (D) according to the invention carrying out a polymerization. In one preferred embodiment of the invention, the cationic photoinitiator (E) is an onium salt of Formula (II). The onium salt releases a Louis acid under radiation rays.

$$[R^{51}_xR^{52}_yR^{53}_zR^{54}_wW]^{+p}A(-p)$$  Formula (II)

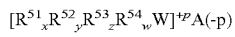

wherein:

W represents an element constituting an onium cation;

$R^{51}$, $R^{52}$, $R^{53}$, $R^{54}$ independently represents a monovalent organic group; or two or more than two of $R^{51}$, $R^{52}$, $R^{53}$, and $R^5$ form a ring with W, and others independently represents a monovalent organic group;

x, y, z and u independently represents an integer from 0 to 3, and (x+y+z+u) is equal to the valence of W;

A(-p) represents p valence of an onium anion; and p is equal to a charge number of the onium cation and onium anion.

In one embodiment of the invention, the element W in Formula (II) is O, S, Se, Te, P, As, Sb, Bi, I, Br, Cl, or —N=N.

Preferably, the onium anion A(-p) in Formula (II) is $[YZ_{v+p}]^{-p}$; wherein Y represents a metal or metal-like atom of a center of a halide complex $[YZ_{v+p}]$; Z represents halide; v represents an atom valence of Y; p is equal to a charge number of the onium anion.

In the onium anion $[YZ_{v+p}]^{-p}$, examples of the metal or metal-like atom are B, P, As, Sb, Fe, Sn, Bi, Al, Ca, In, Ti, Zn, Sc, V, Cr, Mn, or Co.

Examples of the halide Z are F, Cl, Br, or I.

In one preferred embodiment of the invention, $[YZ_{v+p}]^{-p}$ is $BF_4^-$, $PF_6^-$, $SbF_6^-$, $AsF_6^-$, or $SbCl_6^-$.

In another embodiment of the invention, the onium anion A(-p) in Formula (II) is $[YZ_v(OH)]^-$; wherein Y represents a metal or metal-like atom of a center of a halide complex $[YZ_v(OH)]^-$; Z represents halide; v represents an atom valence of Y; p is equal to a charge number of the onium anion. Examples of $[YZ_v(OH)]^-$ are trifluoromethanesulfonate ion ($CF_3SO_3^-$), fluoro-sulfonic acid ion ($FSO_3^-$), perchlorate ion ($ClO_4^-$), p-toluenesulfonate ion, trinitrobenzene sulfonate ion, or trinitrotoluene sulfonate ion.

The onium salt according to the invention is preferably an aromatic onium salt. Exampes are aromatic halide onium salt, VIA of the periodic table aromatic halide onium salt, oxo sulfoxonium salt, aromatic diazonium salt, or thiopyrylium salt.

In addition, an iron/allene complexes or aluminum complexes/photolysis initiator can used as the cationic photoinitiator (E) according to the invention.

Examples of the commercialized cationic photoinitiator (E) are Adekaoptomer SP-150, Adekaoptomer SP-151, Adekaoptomer SP-152, Adekaoptomer SP-170, Adekaoptomer SP-172 (manufactured by ADEKA Co., Ltd), UVI-6950, UVI-6970, UVI-6974, UVI-6990 (all manufactured by Union Carbide Co.), Irgacure 250, Irgacure 261 (all manufactured by Ciba Specialty Chemicals), CI-2064, CI-2481, CI-2624, CI-2639 (all manufactured by Nippon Soda Co., Ltd.), CD-1010, CD-1011, CD-1012 (all manufactured by Sartomer Inc.), DTS-102, DTS-103, NAT-103, NDS-103, TPS-103, MDS-103, MPI-103, BBI-103 (all manufactured by Midori Kagaku Co., Ltd), PCI-020T, PCI-022T, PCI-061T, PCI-062T (all manufactured by Nippon Kayaku Co., Ltd.), CPI-110A (manufactured by SAN-APRO Co.).

Preferably, examples of the commercialized cationic photoinitiator (E) are Adekaoptomer SP-152, AdekaoptomerSP-170, Adekaoptomer SP-172, UVI-6970, UVI-6974, Irgacure 250, CD-1012, MPI-103, and CPI-110A.

The used amount of the cationic photoinitiator (E) is from 5 to 50 parts by weight based on 100 parts by weight of the used amount of the alkali-soluble resin (C); preferably from 6 to 45 parts by weight; more preferably from 7 to 40 parts by weight.

Examples of the cationic photoinitiator (E) can be used alone or in combinations.

If the cationic photoinitiator (E) is absent, the developing-resistance and ageing stability of sensitivity are poor.

The blue photosensitive resin composition of this invention is prepared by dissolving all the above components other than the organic pigment (A) in the organic solvent (F) to prepare a liquid composition followed by homogeneously mixing the liquid composition with the organic pigment (A). The solvent (F) must be able to dissolve the dye (B), alkali-soluble resin (C), cationic polymeric compound (D), and cationic photoinitiator (E). Also, the organic solvent (F) must not be able to react with the components dissolved therein, and has proper volatility.

In one embodiment of the invention, the used amount of the organic solvent (F) is from 500 to 5000 parts by weight based on 100 parts by weight of the used amount of the alkali-soluble resin (C); preferably from 800 to 4500 parts by weight; more preferably from 1000 to 4000 parts by weight.

The organic solvent (F) suitable for preparing the blue photosensitive resin composition can be selected from the examples of the solvent for preparing the alkali-soluble resin (C). Preferably, the solvent (F) suitable for preparing the blue photosensitive resin composition is selected from propylene glycol methyl ether acetate and ethyl 3-ethoxypropionate.

In one preferred embodiment of the invention, the blue photosensitive resin composition for a color filter further comprises a compound having an ethylenically unsaturated group (G).

The compound having an ethylenically unsaturated group (G) refers to an unsaturated compound having at least one ethylenically unsaturated group. Examples of the compound having one ethylenically unsaturated group can be used alone or in admixture of two or more thereof, and include, but are not limited to, acrylamide, acryloylmorpholine, methylacryloylmorpholine, 7-amino-3,7-dimethyloctyl acrylate, 7-amino-3,7-dimethyloctyl methylacrylate, iso-butoxymethyl acrylamide, iso-butoxymethyl methylacrylamide, iso-bornyloxyethyl acrylate, iso-bornyloxyethyl methylacrylate, iso-bornyl acrylate, iso-bornyl methylacrylate, 2-ethylhexyl acrylate, 2-ethylhexyl methylacrylate, ethyl diethylene glycol acrylate, ethyl diethylene glycol methylacrylate, t-octyl acrylamide, t-octyl methylacrylamide, diacetone acrylamide, diacetone methylacrylamide, dimethylaminoethyl acrylate, dimethylaminoethyl methylacrylate, dodecyl acrylate, dodecyl methylacrylate, dicyclopentenyloxyethyl acrylate, dicyclopentenyloxyethyl methylacrylate, dicyclopentenyl acrylate, dicyclopentenyl methylacrylate, N,N-dimethyl acrylamide, N,N-dimethyl methylacrylamide, tetrachlorophenyl acrylate, tetrachlorophenyl methylacrylate, 2-tetrachlorophenoxy ethyl acrylate, 2-tetrachlorophenoxy ethyl methylacrylate, tetrahydrofurfuryl acrylate, tetrahydrofurfuryl methylacrylate, tetrabromophenyl acrylate, tetrabromophenyl methylacrylate, 2-tetrabromophenoxyethyl acrylate, 2-tetrabromophenoxyethyl methylacrylate, 2-trichlorophenoxyethyl acrylate, 2-trichlorophenoxyethyl methylacrylate, tribromophenyl acrylate, tribromophenyl methylacrylate, 2-tribromophenoxyethyl acrylate, 2-tribromophenoxyethyl methylacrylate, 2-hydroxyethyl acrylate, 2-hydroxyethyl methacrylate, 2-hydroxypropyl acrylate, 2-hydroxypropyl methylacrylate, vinylcaprolactam, N-vinylpyrrolidone, phenoxyethyl acrylate, phenoxyethyl methylacrylate, pentachlorophenyl acrylate, pentachlorophenyl methylacrylate, pentabromophenyl acrylate, pentabromophenyl methylacrylate, polyethylene glycol monoacrylate, polyethylene glycol monomethylacrylate, polypropylene glycol monoacrylate, polypropylene glycol monomethylacrylate, bornyl acrylate, and bornyl methylacrylate.

Examples of the compound having two or more ethylenically unsaturated groups can be used alone or in admixture of two or more thereof, and include, but are not limited to, ethylene glycol diacrylate, ethylene glycol dimethylacrylate, dicyclopentenyl diacrylate, dicyclopentenyl dimethylacrylate, triethylene glycol diacrylate, tetraethylene glycol diacrylate, tetraethylene glycol dimethylacrylate, tri(2-hydroxyethyl) isocyanate diacrylate, tri(2-hydroxyethyl) isocyanate dimethylacrylate, tri(2-hydroxyethyl) isocyanate triacrylate, tri(2-hydroxyethyl) isocyanate trimethylacrylate, caprolactone-modified tri(2-hydroxyethyl) isocyanate triacrylate, caprolactone-modified tri(2-hydroxyethyl) isocyanate trimethylacrylate, trimethylolpropyl triacrylate, trimethylolpropyl trimethylacrylate, ethylene oxide (hereinafter abbreviated as EO) modified trimethylolpropyl triacrylate, EO-modified trimethylolpropyl trimethylacrylate, propylene oxide (hereinafter abbreviated as PO) modified trimethylolpropyl triacrylate, PO-modified trimethylolpropyl trimethylacrylate, tripropylene glycol diacrylate, tripropylene glycol dimethylacrylate, neo-pentyl glycol diacrylate, neo-pentyl glycol dimethylacrylate, 1,4-butanediol diacrylate, 1,4-butanediol dimethylacrylate, 1,6-hexanediol diacrylate, 1,6-hexanediol dimethylacrylate, pentaerythritol triacrylate, pentaerythritol trimethylacrylate, pentaerythritol tetraacrylate, pentaerythritol tetramethylacrylate, polyester diacrylate, polyester dimethylacrylate, polyethylene glycol diacrylate, polyethylene glycol dimethylacrylate, dipentaerythritol hexaacrylate, dipentaerythritol hex amethylacrylate, dipentaerythritol pentaacrylate, dipentaerythritol pentamethylacrylate, dipentaerythritol tetraacrylate, dipentaerythritol tetramethylacrylate, caprolactone-modified dipentaerythritol hexaacrylate, caprolactone-modified dipentaerythritol hexamethylacrylate, caprolactone-modified dipentaerythritol pentaacrylate, caprolactone-modified dipentaerythritol pentamethylacrylate, ditrimethylolpropyl tetraacrylate, ditrimethylolpropyl tetramethylacrylate, EO-modified bisphenol A diacrylate, EO-modified bisphenol A dimethylacrylate, PO-modified bisphenol A diacrylate, PO-modified bisphenol A dimethylacrylate, EO-modified hydrogenated bisphenol A diacrylate, EO-modified hydrogenated bisphenol A dimethylacrylate, PO-modified hydrogenated bisphenol A diacrylate, PO-modified hydrogenated bisphenol A dimethylacrylate, PO-modified glycerol triacrylate, EO-modified bisphenol F diacrylate, EO-modified bisphenol F dimethylacrylate, phenol novolac polyglycidyl ether acrylate, phenol novolac polyglycidyl ether methylacrylate, and TO-1382 (manufactured by Toagosei Company).

Preferably, the compound having an ethylenically unsaturated group (G) is selected from trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate, and combinations thereof.

Preferably, the used amount of the compound having an ethylenically unsaturated group (G) is from 30 to 300 parts by weight based on 100 parts by weight of the used amount of the alkali-soluble resin (C); preferably from 40 to 270 parts by weight; more preferably from 50 to 250 parts by weight.

In one preferred embodiment of the invention, the blue photosensitive resin composition for a color filter further comprises a free-radical photoinitiator (H).

Examples of the free-radical photoinitiator (H) can be used alone or in admixture of two or more thereof, and include, but are not limited to, O-acyloxime compounds, triazine compounds, acetophenone compounds, biimidazole compounds, and benzophenone compounds.

Preferably, the used amount of the free-radical photoinitiator (H) is from 10 to 100 parts by weight based on 100 parts by weight of the used amount of the alkali-soluble resin (C); preferably from 15 to 90 parts by weight; more preferably from 20 to 80 parts by weight.

Examples of the O-acyloxime compounds can be used alone or in admixture of two or more thereof, and include, but are not limited to, 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazol-3-yl]-ethylketo 1-(O-acetyloxime), 1-[9-ethyl-6-(3-methylbenzoyl)-9H-carbazol-3-yl]-ethylketo 1-(O-acetyloxime), 1-[9-ethyl-6-benzoyl-9H-carbazol-3-yl]-ethylketo 1-(O-acetyloxime), ethylketo-1-[9-ethyl-6-(2-methyl-4-tetrahydrofurylbenzoyl)-9H-carbazβ1-3-yl]-1-(O-acetyloxime), ethylketo-1-[9-ethyl-6-(2-methyl-5-tetrahydropyranylbenzoyl)-9H-carbazol-3-yl]-1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-(2-methyl-5-tetrahydrofurylmethoxybenzoyl)-9H-carbazol-3-yl]-1-(O-acetyloxime), ethylketo-1-[9-ethyl-6-{2-methyl-4-(2,2-dimethyl-1,3-dioxolyl)benzoyl}-9H-carbazol-3-yl]-1-(O-acetyloxime), and ethylketo-1-[9-ethyl-6-{2-methyl-4-(2,2-dimethyl-1,3-dioxolyl)methoxybenzoyl}-9H-carbazol-3-yl]-1-(O-acetyloxime).

Examples of the triazine compounds can be used alone or in admixture of two or more thereof, and include, but are not limited to, 2,4-bis(trichloromethyl)-6-(p-methoxy)styryl-s-triazine, 2,4-bis(trichloromethyl)-6-(1-p-dimethylaminophenyl-1,3-butadienyl)-s-triazine, and 2-trichloromethyl-4-amino-6-(p-methoxy)styryl-s-triazine.

Examples of the acetophenone compounds can be used alone or in admixture of two or more thereof, and include, but are not limited to, p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, and 2-benzyl-2-N,N-dimethylamino-1-(4-morpholinophenyl)-1-butanone.

Examples of the biimidazole compounds can be used alone or in admixture of two or more thereof, and include, but are not limited to, 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, and 2,2'-bis(2,4-dichlorophenyl)-4,4',5,5'-tetraphenylbiimidazole.

Examples of the benzophenone compounds can be used alone or in admixture of two or more thereof, and include, but are not limited to, thioxanthone, 2,4-diethylthioxanthone, thioxanthone-4-sulfone, benzophenone, 4,4'-bis(dimethylamino)benzophenone, and 4,4'-bis(diethylamino)benzophenone.

Preferably, the free-radical photoinitiator (H) is selected from 1-[4-(phenylthio)phenyl]-octane-1,2-dione 2-(O-benzoyloxime), 1-[9-ethyl-6-(2-methylbenzoyl)-9H-carbazol-3-yl]-ethylketo 1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-{2-methyl-4-(2,2-dimethyl-1,3-dioxolyl)methoxybenzoyl}-9H-carbazol-3-yl]-1-(O-acetyloxime), 2,4-bis(trichloromethyl)-6-(p-methoxy)styryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, 4,4'-bis(diethylamino)benzophenone, and combinations thereof.

In addition to the aforesaid free-radical photoinitiator (H), other initiators can be further added into the blue photosensitive resin composition of the present invention provided that the desirable physical properties of the blue photosensitive resin composition are not affected. Examples of the other initiators include α-diketone compounds, acyloin compounds, acyloin ether compounds, acylphosphineoxide compounds, quinine compounds, halide compounds, peroxide compounds, or the like.

Examples of the α-diketone compounds can be used alone or in admixture of two or more thereof, and include, but are not limited to, benzil and acetyl compounds. Examples of the acyloin compounds can be used alone or in admixture of two or more thereof, and one of the examples thereof is benzoin. Examples of the acyloin ether compounds can be used alone or in admixture of two or more thereof, and include, but are limited to, benzoin methylether, benzoin ethylether, and benzoin isopropyl ether.

Examples of the acylphosphine oxide compounds can be used alone or in admixture of two or more thereof, and include, but are not limited to, 2,4,6-trimethylbenzoyl diphenylphosphine oxide, and bis-(2,6-dimethoxybenzoyl)-2,4,4-trimethyl benzyl phosphine oxide. Examples of the quinone compounds can be used alone or in admixture of two or more thereof, and include, but are not limited to, anthraquinone and 1,4-naphthoquinone. Examples of the halide compounds can be used alone or in admixture of two or more thereof, and include, but are not limited to, phenacyl chloride, tribromomethyl phenylsulfone, and tris(trichloromethyl)-s-triazine Examples of the peroxide compounds can be used alone or in admixture of two or more thereof, and one of the examples thereof is di-tert-butyl peroxide.

When incorporating the compound having an ethylenically unsaturated group (G) and free-radical photoinitiator (H), the developing-resistance is improved.

In one preferred embodiment of the invention, the blue photosensitive resin composition of the present invention can contain other functional additives (I), such as fillers, polymers other than the alkali-soluble resin (C), adhesion-promoting agents, antioxidants, UV absorbents, anti-coagulants, or the like so as to provide the blue filter segment made from the blue photosensitive resin composition with specifically required physical and chemical properties.

The aforesaid examples of the functional additives (I) can be used alone or in admixture of two or more thereof. Examples of the fillers include glass, aluminum, or the like. Examples of the polymers other than the alkali-soluble resin (C) include polyvinyl alcohol, polyethylene glycol monoalkyl ether, polyfluoro alkyl acrylate, or the like. Examples of the adhesion-promoting agents include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryl oxypropyltrimethoxysilane, 3-mercaptopropyltrimethoxysilane, or the like. Examples of the antioxidants include 2,2-thiobis(4-methyl-6-t-butylphenol), 2,6-di-t-butylphenol, or the like. Examples of the UV absorbents include 2-(3-t-butyl-5-methyl-2-hydroxyphenyl)-5-chlorobenzotriazole, alkoxybenzophenone, or the like. Examples of the anti-coagulants include sodium polyacrylate, or the like.

The present invention also provides a method for manufacturing a color filter comprising forming a pixel layer with the blue photosensitive resin composition for a color filter as mentioned above.

The present invention also provides a color filter manufactured by the method as mentioned above.

Preferably, the color filter comprises a pixel layer formed by the blue photosensitive resin composition for a color filter.

The manner for manufacturing the color filter by applying the blue photosensitive resin composition for a color filter according to the invention can be coated on a substrate by a spin coating method, a cast coating method, an ink-jet method, a roller coating method, or the like, and is then dried under reduced pressure to remove most of the solvent. After completely evaporating the residual solvent by pre-baking, a coating film is formed. Operation conditions for the drying under reduced pressure and the pre-baking depend on kinds and amounts of the components used in the photosensitive resin composition. In general, the drying under reduced pressure is carried out at a pressure from 0 to 200 mm Hg for a period from 1 to 60 seconds. The pre-baking is carried out at a temperature from 70° C. to 110° C. for a period from 1 to 15 minutes. The coating film is then exposed to UV light through a specific photo mask, and is developed in a developer solution at a temperature of 23±2° C. for a period from 15 seconds to 5 minutes to dissolve and remove the unexposed portions of the coating film so as to obtain a desired pattern. Preferably, the UV light used for the exposure of the coating film can be g line, h line, i line, or the like. The UV lamp for providing the UV light is a (ultra)high-pressure mercury lamp or a metal halide lamp.

The substrate used to form the color filter is made from bare glass, soda glass, pyres glass, or silica glass, and the glass was coated with a transparent conductive film, or a transparent electrode substrate was used in a solid state image pick up device. A black matrix is formed on the substrate to separate each color pixel element.

The alkali developer is preferably an aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diazabicyclo(5,4,0)-7-undecene, and the like. The concentration of alkali developer is 0.001 wt % to 10 wt %, preferably 0.005 wt % to 5 wt %, and more preferably 0.01 wt % to 1 wt %.

After developing with the developer solution, the resulting pattern is sufficiently washed with water and dried with compressed air or compressed nitrogen.

Finally, it is baked with a heating device such as a hot plate or an oven at 100° C. to 280° C. for 1 to 15 minutes to remove the volatile components of the coating film, and to undergo a thermal reaction with the unreacted ethylenically unsaturated double bonds in the coating film. By repeating the above procedures for photosensitive resin composition comprising red, green and blue pigment dispersed therein, a color filter having arrays of red, green and blue pixels arranged on the substrate is obtained.

Moreover, the ITO electrode film can be formed on the color pixels using a sputtering procedure at 220° C. to 250° C., which can be etched and patterned according to needs. Then, a polyimide polymer is coated on the ITO electrode film to form an alignment layer, and the color filter for LCD is obtained.

The present invention further provides a liquid crystal display device comprising the color filter as mentioned above.

According to the liquid crystal display device, a color filter substrate obtained as mentioned above and a driver substrate with a thin film transistor (TFT) substrate are disposed oppositely, and cell gap is disposed therebetween, and the two substrates are sealed with a sealing agent around the sites of the two substrates. Liquid crystals are then injected into the space defined by the surfaces of the substrates and the sealing agent, and the inject hole is further sealed to form liquid crystal cell. Then, a polarizer is adhered on the outer surface of the liquid crystal cell, i.e. on the other side of each substrate constituting the liquid crystal cell, and the liquid crystal display device is obtained.

The following examples are given for the purpose of illustration only and are not intended to limit the scope of the present invention.

EXAMPLE

Synthesis Example

Preparation of Alkali-Soluble Resin (C)

Synthesis Example 1

A 1000 ml four-necked conical flask equipped with a nitrogen inlet, a stirrer, a heater, a condenser and a thermometer was purged with nitrogen, and was added with 45 parts by weight of 2-methacryloylethoxy succinate, 40 parts by weight of styrene, 15 parts by weight of dicyclopentenyloxyethyl acrylate, and 200 parts by weight of ethyl 3-ethoxypropionate. The ingredients were continuously added into the four-necked conical flask with stirring in an oil bath of 100° C. Four parts by weight of 2,2'-azobis-2-methyl butyronitrile was dissolved into ethyl 3-ethoxypropionate, divided equally into five portions, and added into the four-necked conical flask portionwise within an hour. Polymerization was conducted at 100° C. for 6 hours, and a polymerization product was then taken out of the conical flask followed by removal of solvent from the product so as to obtain an alkali-soluble resin (C-1).

Synthesis Examples 2 to 4

Synthesis Examples 2 to 4 were conducted in a manner identical to that of Synthesis Example 1 with different reaction conditions as well as altered ingredients and amounts which are illustrated in Table 1.

20 parts by weight of the organic pigment (A-1-1) shown in Table 2, 5 parts by weight of the dye (B-1), 20 parts by weight of OXT-101 (hereafter as D-1-1), 5 parts by weight of Adekaoptomer SP-152 (hereafter as E-1), 30 parts by weight of dipentaerythritol hexaacrylate (hereafter as G-1), 10 parts by weight of 2-methyl-1-(4-methylthiophenyl)-2-morpholin-1-propanone (hereafter as H-1) were added into 500 parts by weight of 3-ethoxypropionate (hereafter as F-1) and were mixed and dissolved using a shaker to obtain a blue photosensitive resin composition for a color filter. The obtained blue photosensitive resin composition for a color filter was subjected to assays shown below and the results are shown in Table 2.

Examples 2 to 10 and Comparative Examples 1 to 10

The preparations are similar to that of Example 1 with modifications of the kinds and amounts of the compositions. The compositions and the results of the assays are shown in Tables 2 and 3.

Assays

Contrast:

The examples and the comparative examples of the blue photosensitive resin composition for a color filter were coated on a 100 mm×100 mm glass substrate using a rotation coating method, and decompression drying was first carried out at a pressure of 100 mmHg for 30 seconds, after which pre-bake was implemented at a temperature of 80° C. for 3 minutes, thereby forming a pre-baked coating film of 2.5 μm film thickness. The aforementioned coating film was radiated with UV ray of 300 mJ/cm$^2$ (Canon PLA-501F) and immersed in the developer at 23° C. for 2 minutes. Then, the film was washed with deionized water, and after baking at 200° C. for 80 minutes, a photosensitive resin layer with a thickness of 2.0 μm was formed on the glass substrate.

TABLE 1

| Synthesis Examples | Composition(parts by weight) | | | | | | | | | | Copolymerization Condition | | |
|---|---|---|---|---|---|---|---|---|---|---|---|---|---|
| | Monomers for Copolymerization | | | | | | | Initiator | | Solvent | Feeding manner | Reac. Temp. (° C.) | Reac. Time (hrs) |
| | HOMS | MAA | SM | DCPOA | BzMA | PMI | MA | AMBN | ADVN | EEP | | | |
| C-1 | 45 | | 40 | 15 | | | | 4 | | 200 | Continuous | 100 | 6 |
| C-2 | | 35 | | | 45 | 5 | 15 | 4.5 | | 200 | Continuous | 105 | 6 |
| C-3 | 20 | 20 | 20 | | 20 | | 20 | 4 | | 200 | Continuous | 100 | 5.5 |
| C-4 | 30 | | 15 | 15 | 20 | | 20 | | 4 | 200 | Continuous | 100 | 6 |

HOMS: 2-methacryloylethoxy succinate
MAA: methacrylic acid
SM: styrene monomer
DCPOA: dicyclopentenyloxyethyl acrylate
BzMA: benzyl methacrylate
PMI: N-phenylmaleimide
MA: methyl acrylate
AMBN: 2,2'-azobis-2-methyl butyronitrile
ADVN: 2,2'-Azobis(2,4-dimethylvaleronitrile)
EEP: ethyl 3-ethoxypropionate Examples of Blue Photosensitive Resin Composition for a Color Filter Example 1

One-hundred parts by weight of the alkali-soluble resin (C-1) prepared according to the above mentioned Synthesis, The brightness of the 2.0 μm photosensitive resin layer obtained was measured by the methods depicted in FIG. 1 and FIG. 2. In which, the photosensitive resin layer (1) obtained was placed between two polarizing filters (2), (3), and the light emanating from a light source (4) was made to sequentially penetrate the polarizing filter (2), the photosensitive resin layer (1), and the polarizing filter (3), the brightness (cd/cm$^2$) finally penetrating the polarizing filter (3) was then measured using a brightness meter (5) (manufactured by Japan Topcon Company, model No. BM-5A).

Referring to FIG. 1, when the polarization direction of the polarizing filter (3) and the polarization direction of the polarizing filter (2) were mutually parallel, then the measured brightness was A (cd/cm$^2$). In addition, referring to FIG. 2 again, when the polarization direction of the polarizing filter (3) and the polarization direction of the polarizing filter (2) were mutually perpendicular, then the measured brightness was B (cd/cm$^2$). Accordingly, the contrast was obtained using the ratio of brightness A and the brightness B (brightness A/brightness B), the evaluation criteria being as follows:

⊚: 1500≤(brightness A/brightness B)
○: 1200≤(brightness A/brightness B)<1500
Δ: 900≤(brightness A/brightness B)<1200
X: (brightness A/brightness B)<900

Developing-Resistance:

The examples and the comparative examples of the blue photosensitive resin composition for a color filter were coated on a 100 mm×100 mm glass substrate using a rotation coating method, and decompression drying was first carried out at a pressure of 100 mmHg for 30 seconds, after which pre-bake was implemented at a temperature of 80° C. for 3 minutes, thereby forming a pre-baked coating film of 2.5 μm film thickness. Then, the chromaticity (L*, a*, b*) was measured by the chromometer (Otsuka Electronics Co., Ltd., Model MCPD).

The aforementioned coating film was radiated with UV ray of 100 mJ/cm$^2$ (Canon PLA-501F) and immersed in the developer at 23° C. for 1 minute. Then, the film was washed with deionized water. The chromaticity was measured again. If the resulting change in chromaticity (ΔEab*) is smaller, the developing-resistance is better. The difference of the chromaticity (ΔEab*) was measured as below:

$$\Delta Eab^* = \{(\Delta L)^2 + (\Delta a)^2 + (\Delta b)^2\}^{1/2}$$

⊚: ΔEab*<2
○: 2≤ΔEab*<4
Δ: 4≤ΔEab*<6
X: 6≤ΔEab*

Ageing Stability of Sensitivity:

The resulting blue photosensitive resin composition for a color filter was kept at 45° C. for 3 days. The size difference (ΔCD) of the color pattern of the exposure unit before and after keeping were measured with the scanning electron microscope (manufactured by Hitachi, Ltd, S-9260) (ΔCD=size of the color pattern of the exposure unit before keeping–size of the color pattern of the exposure unit after keeping). The criteria are shown below.

⊚: ΔCD≤0.02 μm
○: 0.02 μm<ΔCD≤0.05 μm
Δ: 0.05 μm<ΔCD≤0.07 μm
X: ΔCD<0.07 μm

Color Reproduction:

The resulting blue photosensitive resin composition for a color filter was applied for manufacturing a color liquid crystal display device according to the method mentioned above.

CIE chromaticity coordinate value of a color liquid crystal display device was determined using the colorimeter. NTSC ratio can be obtained by dividing color gamut of measured CIE chromaticity coordinates by color gamut of standard CIE chromaticity coordinates. A higher NTSC ratio means better color reproduction.

⊚: NTSC ratio>90%
○: 85%<NTSC ratio≤90%
Δ: 80%<NTSC ratio≤85%
X: NTSC ratio≤80%

TABLE 2

Contents and Assays of Examples of the Blue Photosensitive Resin Composition For a Color Filter

| Components | | | Example | | | | | | | | | |
|---|---|---|---|---|---|---|---|---|---|---|---|---|
| | | | 1 | 2 | 3 | 4 | 5 | 6 | 7 | 8 | 9 | 10 |
| organic pigment (A) (parts by weight) | A-1 | A-1-1 | 20 | | | 100 | | | 20 | | | 100 |
| | | A-1-2 | | 50 | | | 150 | | | 200 | | 50 |
| | A-2 | A-2-1 | | | | 30 | | | 10 | | | |
| | | A-2-2 | | | | 20 | | | | 100 | | |
| | A-3 | A-3-1 | | | 80 | | | 200 | | | 100 | |
| dye (B) (parts by weight) | B-1 | Formula (1) | 5 | | | | 20 | | | | 10 | |
| | B-2 | Formula (22) | | 10 | | | 30 | 30 | | | 20 | 20 |
| | B-3 | Formula (28) | | | 20 | | | | 40 | | | 30 |
| | B-4 | Formula (31) | | | | 30 | | | | 50 | | |
| alkali-soluble resin (C) (parts by weight) | C-1 | | 100 | | | | 100 | | | 30 | 50 | |
| | C-2 | | | 100 | | | | 100 | | | 50 | 70 |
| | C-3 | | | | 100 | | | | 100 | | | 30 |
| | C-4 | | | | | 100 | | | | 70 | | |
| cationic polymeric compound (D) (parts by weight) | D-1 | D-1-1 | 20 | | | | 200 | | | | 100 | |
| | | D-1-2 | | 50 | | | | 100 | | | | |
| | | D-1-3 | | | 100 | | | 100 | 20 | | | |
| | | D-1-4 | | | | 150 | | | | 100 | | |
| | D-2 | D-2-1 | | | | | | | | 10 | 50 | |
| | | D-2-2 | | | | | | | | | 50 | 200 |
| cationic photoinitiator (E) (parts by weight) | E-1 | | 5 | | | | 50 | 30 | | | | 10 |
| | E-2 | | | 20 | | | | 20 | 10 | | | 40 |
| | E-3 | | | | 30 | | | | | 15 | 20 | |
| | E-4 | | | | | 40 | | | | | 20 | |
| organic solvent (F) (parts by weight) | F-1 | | 500 | 1000 | 2000 | 3000 | 4000 | 5000 | | 2000 | 3000 | 2000 |
| | F-2 | | | | | | | | 3000 | 3000 | | 2000 |
| compound having an ethylenically unsaturated group (G) | G-1 | | 30 | | | | | | 100 | | | |
| | G-2 | | | | | | | | | | 150 | |
| | G-3 | | | | | | | | | | 150 | |

TABLE 2-continued

Contents and Assays of Examples of the Blue Photosensitive Resin Composition For a Color Filter

| Components | | Example 1 | 2 | 3 | 4 | 5 | 6 | 7 | 8 | 9 | 10 |
|---|---|---|---|---|---|---|---|---|---|---|---|
| (parts by weight) | | | | | | | | | | | |
| free-radical photoinitiator (H) (parts by weight) | H-1 | 10 | | | | | | 30 | 60 | | |
| | H-2 | | | | | | | | 40 | | |
| | H-3 | | | | | | | 20 | | | |
| additives (I) (parts by weight) | I-1 | | | | | 1 | | | | | |
| | I-2 | | | | | | | | | | 5 |
| Assays | Contrast | ◎ | ◎ | ◎ | ◎ | ◎ | ◎ | ◎ | ◎ | ◎ | ◎ |
| | Color Reproduction | ◎ | ◎ | ○ | ◎ | ◎ | ○ | ◎ | ◎ | ○ | ◎ |
| | Ageing Stability of Sensitivity | ◎ | ◎ | ◎ | ◎ | ◎ | ◎ | ◎ | ◎ | ◎ | ○ |
| | Developing-Resistance | ◎ | ○ | ○ | ○ | ○ | ○ | ◎ | ◎ | ○ | ○ |

TABLE 3

Contents and Assays of Comparative Examples of the Blue Photosensitive Resin Composition For a Color Filter

| Components | | | Comparative Examples 1 | 2 | 3 | 4 | 5 | 6 | 7 | 8 | 9 | 10 |
|---|---|---|---|---|---|---|---|---|---|---|---|---|
| organic pigment (A) (parts by weight) | A-1 | A-1-1 | | 100 | | | | | | 100 | | |
| | | A-1-2 | | | 150 | | | | | | 150 | |
| | A-2 | A-2-1 | | | | | | | | | | |
| | | A-2-2 | | | | | | | | | | |
| | A-3 | A-3-1 | | | | 200 | | | | | | 200 |
| dye (B) (parts by weight) | B-1 | Formula (1) | 50 | | | | 50 | | | | | |
| | B-2 | Formula (22) | | | | | | 40 | | | | |
| | B-3 | Formula (28) | | | 40 | | | | 30 | | | |
| | B-4 | Formula (31) | | | | 30 | | | | | | |
| alkali-soluble resin (C) (parts by weight) | C-1 | | 100 | | | | 100 | | | 100 | | |
| | C-2 | | | 100 | | | | 100 | | | | 100 |
| | C-3 | | | | 100 | | | | 100 | | | |
| | C-4 | | | | | 100 | | | | 100 | | |
| cationic polymeric compound (D) (parts by weight) | D-1 | D-1-1 | 30 | | | | | | | | 50 | |
| | | D-1-2 | | 40 | | | | | | | | |
| | | D-1-3 | | | | 60 | | | | | | |
| | | D-1-4 | | | | | | | 80 | | | |
| | D-2 | D-2-1 | | | | | | | | | 50 | |
| | | D-2-2 | | | | | | | | | | |
| cationic photoinitiator (E) (parts by weight) | E-1 | | 10 | | | | 10 | | | | | |
| | E-2 | | | 20 | | | | | | | | |
| | E-3 | | | | 30 | | | | | | | |
| | E-4 | | | | | | | | | 40 | | |
| organic solvent (F) (parts by weight) | F-1 | | 500 | | 2000 | 500 | 500 | | 500 | | 2000 | 500 |
| | F-2 | | | 1000 | | 2000 | | 500 | | 1000 | | 2000 |
| compound having an ethylenically unsaturated group (G) (parts by weight) | G-1 | | | | | | | | | 100 | | 200 |
| | G-2 | | | | | | | | | | | |
| | G-3 | | | | | | | | | | | |
| free-radical photoinitiator (H) (parts by weight) | H-1 | | | | | | | | | 20 | | 30 |
| | H-2 | | | | | | | | | | | 20 |
| | H-3 | | | | | | | | | | | |
| additives (I) (parts by weight) | I-1 | | | | | | | | | | | |
| | I-2 | | | | | | | | | | | |
| Assays | Contrast | | ○ | X | ○ | ○ | ○ | ○ | ○ | X | X | X |
| | Color Reproduction | | X | ○ | ○ | ○ | X | X | X | ○ | ○ | ○ |

TABLE 3-continued

Contents and Assays of Comparative Examples of the Blue
Photosensitive Resin Composition For a Color Filter

| Components | Comparative Examples | | | | | | | | | |
|---|---|---|---|---|---|---|---|---|---|---|
| | 1 | 2 | 3 | 4 | 5 | 6 | 7 | 8 | 9 | 10 |
| Ageing Stability of Sensitivity | ○ | ○ | X | X | X | X | X | X | X | X |
| Developing-Resistance | ○ | ○ | X | X | X | X | Δ | X | X | Δ |

In Tables 2 and 3:
A-1-1 C.I Pigment Blue 15:4
A-1-2 C.I Pigment Blue 15:6
A-2-1 C.I Pigment Violet 19
A-2-2 C.I Pigment Violet 23
A-3-1 C.I Pigment Blue 60
B-1 Formula (1)
B-2 Formula (22)
B-3 Formula (28)
B-4 Formula (31)
D-1-1 OXT-101 (manufactured by Toagosei Company, Limited)
D-1-2 OXT-121 (manufactured by Toagosei Company, Limited)
D-1-3 OXT-213 (manufactured by Toagosei Company, Limited)
D-1-4 OXT-221 (manufactured by Toagosei Company, Limited)
D-2-1 TDVE (manufactured by Maruzen Petrochemical)
D-2-2 TMPVE (manufactured by Nippon Carbide Industries Co., Inc)
E-1 Adekaoptomer SP-152 (manufactured by ADEKA Co., Ltd)
E-2 Irgacure 261 (manufactured by Ciba Specialty Chemicals)
E-3 UVI-6974 (manufactured by Union Carbide Co.)
E-4 PCI-062T (manufactured by Nippon Kayaku Co., Ltd.)
F-1 3-ethoxypropionate
F-2 propylene glycol methyl ether acetate
G-1 dipentaerythritol hexaacrylate (manufactured by Toagosei Company, Limited)
G-2 trimethylolpropyl triacrylate
G-3 TO-1382 (manufactured by Toagosei Company, Limited)
H-1 2-methyl-1-(4-methylthiophenyl)-2-morpholin-1-propanone
H-2 2,2'-bis(2,4-dichlorophenyl)-4,4',5,5'-tetraphenylbiimidazole
H-3 4,4'-bis(diethylamino)benzophenone
I-1 3-glycidyloxypropyltrimethoxysilane
I-2 2,2-thiobis(4-methyl-6-t-butylphenol)

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:
1. A blue photosensitive resin composition for a color filter comprising:
an organic pigment (A);
a dye (B);
an alkali-soluble resin (C);
a cationic polymeric compound (D);
a cationic photoinitiator (E); and
an organic solvent (F);
wherein the dye (B) comprises a red dye represented by Formula (I):

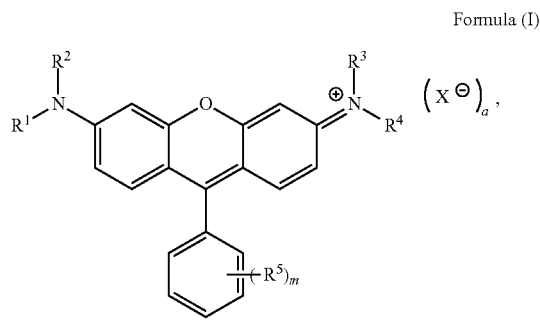

Formula (I)

wherein:
$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of halogen, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;
$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;
m is an integer ranging from 0 to 5, a plurality of $R^5$s being the same or different when m is from 2 to 5;
X represents halogen;
a is 0 or 1;
$R^6$ is a $C_1$-$C_{10}$ alkyl group unsubstituted or substituted with halogen; wherein —$CH_2$— contained in said $C_1$-$C_{10}$ alkyl group is un-replaced or replaced with —O—, carbonyl, or —$NR^7$—;
$R^7$ is a $C_1$-$C_{10}$ alkyl group unsubstituted or substituted with halogen;
$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein the hydrogen in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —OH, halogen, -Q, —CH=$CH_2$, and —CH=CH—$R^6$; and the —$CH_2$— in the $C_1$-$C_{10}$ linear alkyl group, $C_1$-$C_{10}$ branched chain alkyl group, and $C_3$-$C_{30}$ cycloalkyl group is unsubstituted or substituted with a substituent selected from the group consisting of —O—, carbonyl, and —$NR^7$—; or R$^8$ and R$^9$ join together to form a C$_1$-C$_{10}$ heterocyclic group; wherein the hydrogen in the C$_1$-C$_{10}$ heterocyclic group is unsubstituted or substituted with a substituent selected from the group consisting of R$^6$, —OH and -Q;

Q is selected from the group consisting of a C$_6$-C$_{10}$ aryl group, a C$_5$-C$_{10}$ heteroaryl group, a C$_6$-C$_{10}$ aryl group substituted with a substituent selected from the group consisting of halogen, —R$^6$, —OH, —OR$^6$, —NO$_2$, —CH=CH$_2$, and —CH=CH—R$^6$, and a C$_5$-C$_{10}$ heteroaryl group substituted with a substituent selected from the group consisting of halogen, —R$^6$, —OH, —OR$^6$, —NO$_2$, —CH=CH$_2$, and —CH=CH—R$^6$; and M is selected from the group consisting of potassium and sodium; and the cationic polymeric compound (D) comprises a compound (D-1) containing an oxetanyl group.

2. The blue photosensitive resin composition for a color filter according to claim 1, wherein the dye (B) comprises a red dye represented by Formula (I-1) and/or a red dye represented by Formula (I-2) and/or a red dye represented by Formula (I-3) and/or a red dye represented by Formula (I-4):

Formula (I-1)

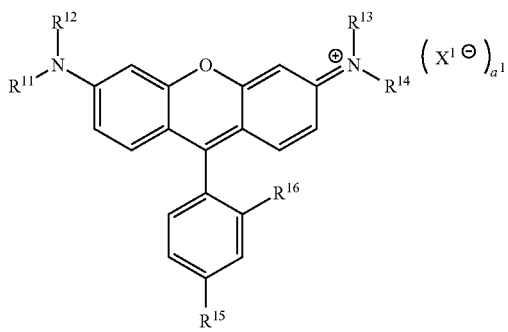

wherein:
R$^{11}$, R$^{12}$, R$^{13}$, and R$^{14}$ are independently selected from the group consisting of hydrogen, —R$^6$, and a C$_6$-C$_{10}$ aryl group, said C$_6$-C$_{10}$ aryl group being unsubstituted or substituted with a substituent selected from the group consisting of halogen, —R$^6$, —OH, —OR$^6$, —SO$_3^{31}$, —SO$_3$H, —SO$_3$Na, —COOH, —COOR$^6$, —SO$_3$R$^6$, —SO$_2$NHR$^8$, and —SO$_2$NR$^8$R$^9$;

R$^{15}$ is selected from the group consisting of hydrogen, —SO$_3^-$, —SO$_3$H, —SO$_2$NHR$^8$, and —SO$_2$NR$^8$R$^9$;

R$^{16}$ is selected from the group consisting of —SO$_3^-$, —SO$_3$H, —SO$_2$NHR$^8$, and —SO$_2$NR$^8$R$^9$;

X$^1$ is halogen; and
a$^1$ is 0 or 1;

Formula (I-2)

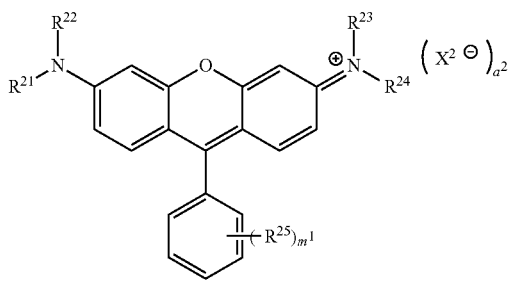

wherein:
R$^{21}$, R$^{22}$, R$^{23}$, and R$^{24}$ are independently selected from the group consisting of hydrogen, —R$^{26}$, and a C$_6$-C$_{10}$ aryl group unsubstituted or substituted with a substituent selected from the group consisting of halogen, —R$^{26}$, —OH, —OR$^{26}$, —SO$_3^-$, —SO$_3$H, —SO$_3$Na, —COOH, —COOR$^{26}$, —SO$_3$R$^{26}$, and —SO$_2$NHR$^{28}$;

R$^{25}$ is selected from the group consisting of —SO$_3^-$, —SO$_3$Na, —COOH, —COOR$^{26}$, —SO$_3$H, and —SO$_2$NHR$^{28}$;

m$^1$ is an integer ranging from 0 to 5, a plurality of R$^{25}$s being the same or different when m$^1$ is from 2 to 5;

X$^2$ represents halogen;

a$^2$ is 0 or 1;

R$^{26}$ is a C$_1$-C$_{10}$ alkyl group unsubstituted or substituted with a substituent selected from the group consisting of halogen and —OR$^{27}$;

R$^{27}$ is a C$_1$-C$_{10}$ alkyl group; and

R$^{28}$ is selected from the group consisting of hydrogen, —R$^{26}$, —COOR$^{26}$, and a C$_6$-C$_{10}$ aryl group unsubstituted or substituted with a substituent selected from the group consisting of —R$^{26}$ and —OR$^{26}$;

Formula (I-3)

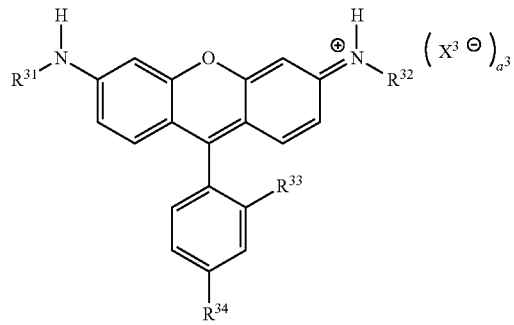

wherein:
R$^{31}$ and R$^{32}$ are independently phenyl unsubstituted or substituted with a substituent selected from the group consisting of halogen, —R$^{26}$, —OR$^{26}$, —COOR$^{26}$, —SO$_3$R$^{26}$, and —SO$_2$NHR$^{28}$;

R$^{33}$ is selected from the group consisting of —SO$_3^-$ and —SO$_2$NHR$^{28}$;

R$^{34}$ is selected from the group consisting of hydrogen, —SO$_3^-$, and —SO$_2$NHR$^{28}$;

X$^3$ is halogen;

a$^3$ is 0 or 1;

R$^{26}$ is a C$_1$-C$_{10}$ alkyl group unsubstituted or substituted with a substituent selected from the group consisting of halogen and —OR$^{27}$;

R$^{27}$ is a C$_1$-C$_{10}$ alkyl group; and

R$^{28}$ is selected from the group consisting of hydrogen, —R$^{26}$, —COOR$^{26}$, and a C$_6$-C$_{10}$ aryl group unsubstituted or substituted with a substituent selected from the group consisting of —R$^{26}$ and —OR$^{26}$;

Formula (I-4)

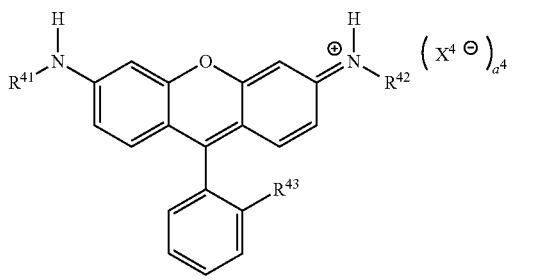

wherein:
- $R^{41}$ and $R^{42}$ are independently phenyl unsubstituted or substituted with a substituent selected from the group consisting of —$R^{26}$ and —$SO_2NHR^{28}$;
- $R^{43}$ is selected from the group consisting of —$SO_3^-$ and —$SO_2NHR^{28}$;
- $X^4$ is halogen;
- $a^4$ is 0 or 1;
- $R^{26}$ is $C_1$-$C_{10}$ alkyl group unsubstituted or substituted with a substituent selected from the group consisting of halogen and —$OR^{27}$;
- $R^{27}$ is a $C_1$-$C_{10}$ alkyl group; and
- $R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

3. The blue photosensitive resin composition for a color filter according to claim 1, wherein the used amount of the organic pigment (A) is from 30 to 300 parts by weight; the used amount of the dye (B) is from 5 to 50 parts by weight; the used amount of the cationic polymeric compound (D) is from 20 to 200 parts by weight; the used amount of the cationic photoinitiator (E) is from 5 to 50 parts by weight; and the used amount of the organic solvent (F) is from 500 to 5000 parts by weight based on 100 parts by weight of the used amount of the alkali-soluble resin (C).

4. The blue photosensitive resin composition for a color filter according to claim 1, wherein the organic pigment (A) comprises a copper phthalocyanine-based blue pigment (A-1).

5. The blue photosensitive resin composition for a color filter according to claim 4, wherein the used amount of the copper phthalocyanine-based blue pigment (A-1) is from 20 to 200 parts by weight based on 100 parts by weight of the used amount of the alkali-soluble resin (C).

6. The blue photosensitive resin composition for a color filter according to claim 1, wherein the organic pigment (A) comprises a violet organic pigment (A-2).

7. The blue photosensitive resin composition for a color filter according to claim 6, wherein the used amount of the violet organic pigment (A-2) is from 10 to 100 parts by weight based on 100 parts by weight of the used amount of the alkali-soluble resin (C).

8. The blue photosensitive resin composition for a color filter according to claim 1, wherein the used amount of the oxetane compound (D-1) is from 20 to 200 parts by weight based on 100 parts by weight of the used amount of the alkali-soluble resin (C).

9. The blue photosensitive resin composition for a color filter according to claim 1, which further comprises a compound having an ethylenically unsaturated group (G).

10. The blue photosensitive resin composition for a color filter according to claim 9, wherein the used amount of the compound having an ethylenically unsaturated group (G) is from 30 to 300 parts by weight based on 100 parts by weight of the used amount of the alkali-soluble resin (C).

11. The blue photosensitive resin composition for a color filter according to claim 1, which further comprises a free-radical photoinitiator (H).

12. The blue photosensitive resin composition for a color filter according to claim 11, wherein the used amount of the free-radical photoinitiator (H) is from 10 to 100 parts by weight based on 100 parts by weight of the used amount of the alkali-soluble resin (C).

13. A method for manufacturing a color filter comprising forming a pattern with the blue photosensitive resin composition for a color filter according to claim 1.

14. A color filter manufactured by the method according to claim 13.

15. A liquid crystal display device comprising the color filter according to claim 14.

16. The blue photosensitive resin composition for the color filter according to claim 1, wherein the cationic photoinitiator (E) is an onium salt of Formula (II):

$$[R^{51}_xR^{52}_yR^{53}_zR^{54}_uW]^{+p}A(-p) \qquad \text{Formula (II)},$$

wherein:
- W represents an element constituting an onium cation;
- $R^{51}$, $R^{52}$, $R^{53}$, and $R^{54}$ independently represents a monovalent organic group; or two or more than two of $R^{51}$, $R^{52}$, $R^{53}$, and $R^{54}$ form a ring with W, and others independently represent a monovalent organic group;
- x, y, z and u independently represents an integer from 0 to 3 and (x+y+z+u) is equal to the valence of W;
- A(−p) represents p valence of an onium anion; and
- p is equal to a charge number of the onium cation and onium anion.

* * * * *